(12) United States Patent
Ning et al.

(10) Patent No.: US 11,961,566 B2
(45) Date of Patent: Apr. 16, 2024

(54) FAST BIT ERASE FOR UPPER TAIL TIGHTENING OF THRESHOLD VOLTAGE DISTRIBUTIONS

(71) Applicant: Micron Technology, Inc., Boise, ID (US)

(72) Inventors: Sheyang Ning, San Jose, CA (US); Lawrence Celso Miranda, San Jose, CA (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 17/833,466

(22) Filed: Jun. 6, 2022

(65) Prior Publication Data

US 2023/0034752 A1 Feb. 2, 2023

Related U.S. Application Data

(60) Provisional application No. 63/224,263, filed on Jul. 21, 2021.

(51) Int. Cl.
| | |
|---|---|
| *G11C 16/16* | (2006.01) |
| *G11C 16/04* | (2006.01) |
| *G11C 16/08* | (2006.01) |
| *G11C 16/24* | (2006.01) |
| *G11C 16/26* | (2006.01) |
| *G11C 16/34* | (2006.01) |

(52) U.S. Cl.
CPC .......... *G11C 16/16* (2013.01); *G11C 16/0433* (2013.01); *G11C 16/08* (2013.01); *G11C 16/24* (2013.01); *G11C 16/26* (2013.01); *G11C 16/3404* (2013.01); *G11C 16/3481* (2013.01)

(58) Field of Classification Search
CPC ..... G11C 16/16; G11C 16/0433; G11C 16/08; G11C 16/24; G11C 16/26; G11C 16/3404; G11C 16/3481
See application file for complete search history.

(56) References Cited

U.S. PATENT DOCUMENTS

| | | | | |
|---|---|---|---|---|
| 8,817,538 | B2 * | 8/2014 | Itagaki | H10B 43/27 |
| | | | | 365/185.11 |
| 9,490,019 | B2 * | 11/2016 | Itagaki | G11C 16/08 |
| 10,832,778 | B1 * | 11/2020 | Yang | G11C 16/24 |

* cited by examiner

*Primary Examiner* — Vanthu T Nguyen
(74) *Attorney, Agent, or Firm* — Lowenstein Sandler LLP

(57) ABSTRACT

A memory device includes a first pillar coupled with a first data line, a second pillar coupled with a second data line, wordlines coupled with first and second pillars. Control logic is to cause: wordlines to be discharged after a program pulse is applied to selected wordline; a supply voltage be applied to second data line to cause a voltage of second pillar to float; a ground voltage be applied to first data line to inhibit soft erase via first pillar; unselected wordlines be charged to boost channel voltages in memory cells coupled with the second pillar; and one of the ground voltage or a negative voltage be applied to the selected wordline to increase soft erase voltage between a channel of a memory cell coupled with the second pillar and the selected wordline, causing a threshold voltage stored in the memory cell to be erased.

20 Claims, 15 Drawing Sheets

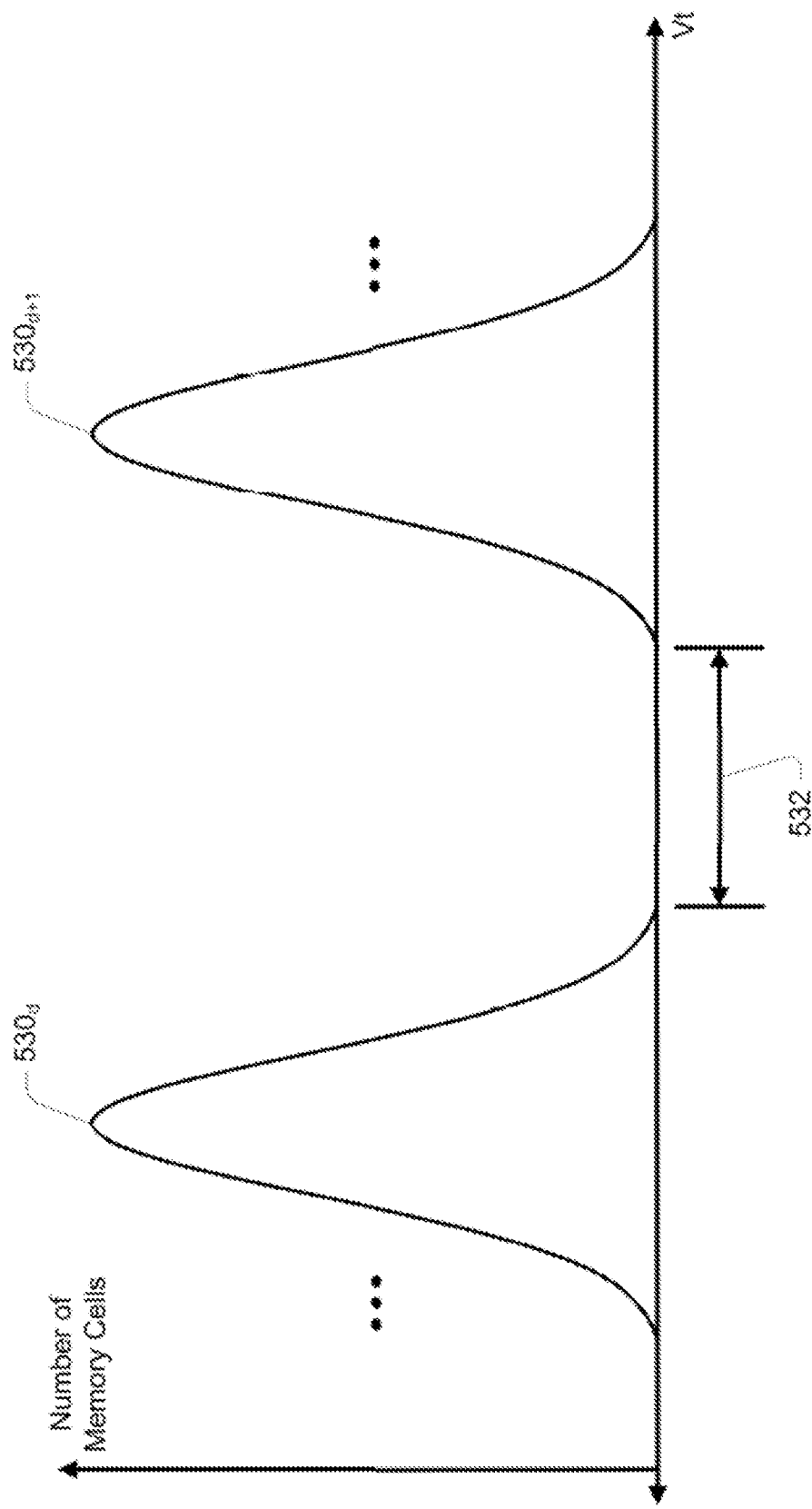

1500

```
┌─────────────────────────────────────────────────┐
│ Cause wordlines of a memory device to be        │
│ discharged after a program pulse programs one   │
│ or more memory cells coupled with a selected    │
│ wordline of the wordlines.                      │
│                      1510                       │
└─────────────────────────────────────────────────┘
                         ↓
┌─────────────────────────────────────────────────┐
│ Initially cause unselected wordlines to be      │
│ charged to a first voltage level to boost a     │
│ channel voltage in memory cells coupled with a  │
│ second pillar.                                  │
│                      1520                       │
└─────────────────────────────────────────────────┘
                         ↓
┌─────────────────────────────────────────────────┐
│ After a period of time, cause the unselected    │
│ wordlines to be charged to a second voltage     │
│ level that is higher than the first voltage     │
│ level.                                          │
│                      1530                       │
└─────────────────────────────────────────────────┘
                         ↓
┌─────────────────────────────────────────────────┐
│ Cause a supply voltage to be applied to the     │
│ second data line to cause a voltage of the      │
│ second pillar to float.                         │
│                      1540                       │
└─────────────────────────────────────────────────┘
                         ↓
┌─────────────────────────────────────────────────┐
│ Initially cause a ground voltage to be applied  │
│ to the first data line to inhibit soft erase    │
│ via the first pillar.                           │
│                      1550                       │
└─────────────────────────────────────────────────┘
                         ↓
┌─────────────────────────────────────────────────┐
│ During the period of time, transition to cause  │
│ the supply voltage to be applied to the first   │
│ data line to also cause a voltage of the first  │
│ pillar to float.                                │
│                      1560                       │
└─────────────────────────────────────────────────┘
                         ↓
┌─────────────────────────────────────────────────┐
│ Cause one of the ground voltage or a negative   │
│ voltage to be applied to the selected wordline  │
│ to increase a soft erase voltage between a      │
│ channel of a memory cell coupled with the       │
│ second pillar and the selected wordline.        │
│                      1570                       │
└─────────────────────────────────────────────────┘
```

FIG. 15

FAST BIT ERASE FOR UPPER TAIL TIGHTENING OF THRESHOLD VOLTAGE DISTRIBUTIONS

REFERENCE TO RELATED APPLICATION

This application claims the benefit of U.S. Provisional Patent Application No. 63/224,263, filed Jul. 21, 2021, the entirety of which is incorporated herein by reference.

TECHNICAL FIELD

Embodiments of the disclosure are generally related to memory sub-systems, and more specifically, relate to fast bit erase for upper tail tightening of threshold voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIGS. 5A-5B are conceptual depictions of threshold voltage distributions of multiple memory cells at different stages following programming for use with various embodiments.

FIG. 15 is a flow diagram of an example method of performing a fast bit erase operation on any threshold voltage distribution according to some embodiments.

DETAILED DESCRIPTION

Figure 1A:
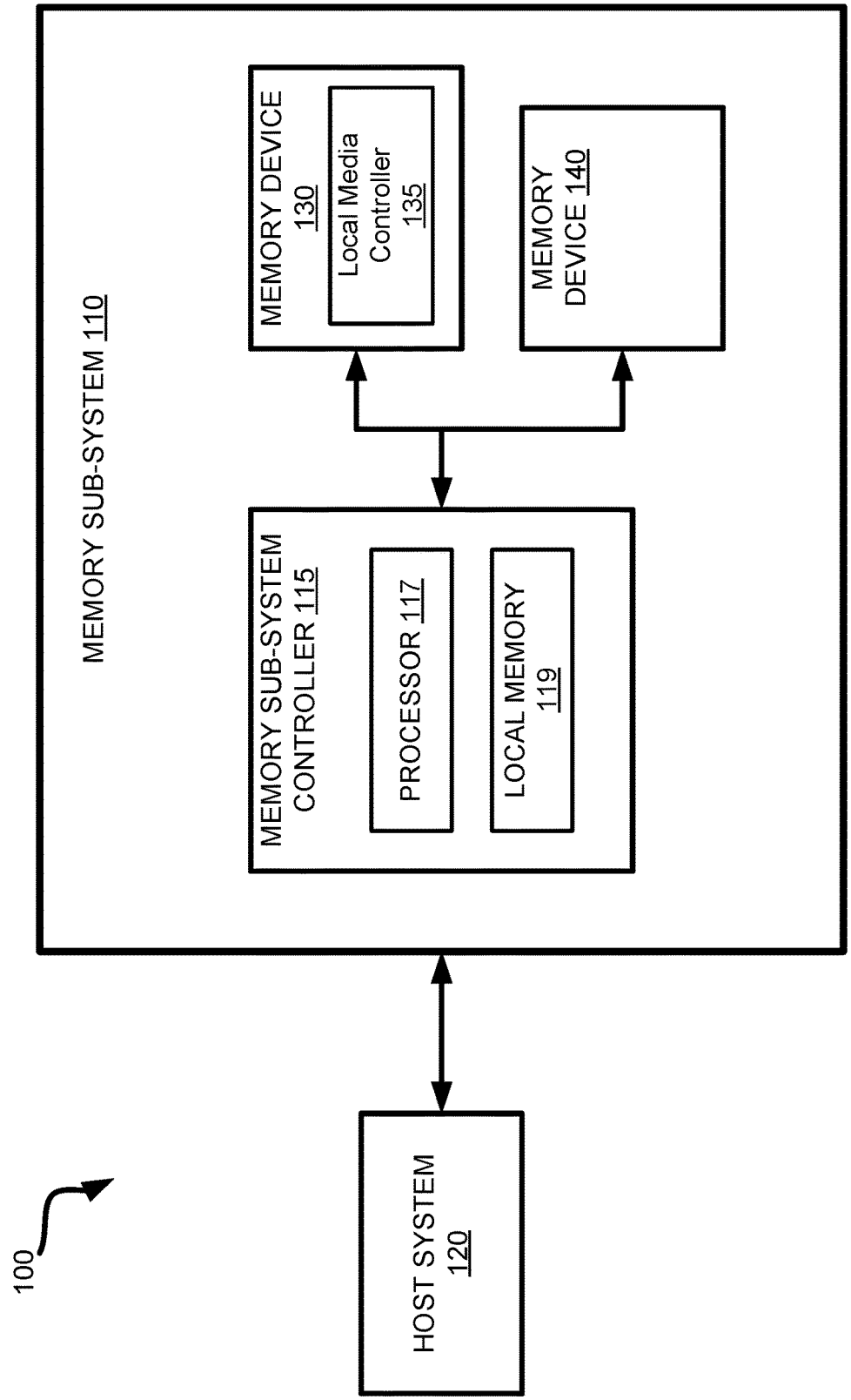
FIG. 1A illustrates an example computing system that includes a memory sub-system according to some embodiments.

Embodiments of the present disclosure are directed to fast bit erase for upper tail tightening of a threshold voltage distribution, e.g., within memory cells of a memory device. The memory device can be a non-volatile memory device, such as negative-and (NAND), for example. The memory device can be made up of the memory cells arranged in a two-dimensional (2D) or (3D) three-dimensional grid, where each memory cell can store a threshold voltage corresponding to one or more logical bits. The memory cells are etched onto a silicon wafer in an array of columns (also hereinafter referred to as bitlines or data lines) and rows (also hereinafter referred to as wordlines). A wordline can refer to one or more rows of memory cells of a memory device that are used with one or more bitlines to generate the address of each of the memory cells.

In some embodiments of 3D NAND, physical conductive pillars can be formed in semiconductor layers to provide the primary conductive path between a data line and a sub-block of memory cells. For example, a string of memory cells can be coupled with the pillar so as to be jointly controllable from the data line that is also coupled with the pillar, which will be discussed in more detail. In certain memory devices, a number of pillars can be combined to form a block of memory cells. Erasing the memory cells to prepare to program new data to those memory cells is usually performed at a physical block level. Then, when memory cells are programmed, charge is injected into the memory cells from the pillars to cause each memory cell to store a certain level of charge.

In at least some embodiments, a group of memory cells are programmed to store levels of charge encoding logical bits of data. Often, the group of memory cells is a page of memory cells coupled with the same wordline. More specifically, the memory cells can each store a level of charge that falls within one of multiple threshold voltage ranges to form a threshold voltage (Vt) distribution. Each Vt range represents a data state corresponding to a bit pattern of a number of logical bits, which depends on how many different states can be stored in each memory cell. For example, in triple-level cells (TLC), a Vt distribution can correspond to one of eight different logical states (each representing a different combination of three bits). Further, in a quad-level cell (QLC), a Vt distribution can correspond to one of 16 different logical states (each representing a different combination of four bits). Additionally, in penta-level cells (PLC), a Vt distribution can correspond to one of 32 different logical states (each representing a different combination of five bits). As cells are partitioned into additional threshold voltage ranges to capture additional logical bit patterns, the threshold voltage ranges can become narrower.

In various embodiments, the level of charge of multiple memory cells remaining after programming the multiple memory cells (e.g., a page of memory cells, a string of memory cells, a sub-block of memory cells, or a block of memory cells) can form Vt distributions. The Vt distributions can represent some portion of the distributions for threshold voltage ranges at the completion of programming, thus encoding data within the multiple memory cells that can be read out later. Adjacent Vt distributions can be separated by a margin (or dead space), which is sometimes referred to as read window budget (RWB) because the margin provides separation by which the threshold voltage distributions can be separately measured. Quick charge loss as well as longer-term charge loss can cause threshold voltage distributions to widen and at least partially overlap, reducing the RWB and making it more difficult to measure separate threshold voltage distributions, e.g., which is often performed at an upper tail portion of each threshold voltage distribution.

In certain memory devices, the margin or RWB between threshold voltage distributions can be increased (e.g., by tightening the threshold voltage distributions) by performing incremental programming of the memory cells and performing a program verify operation in between programming pulses. Upon verifying that a memory cell reaches a threshold voltage value associated with a program verify voltage, the memory cell is considered programmed and can be inhibited during further programming. Despite performing this type of incremental programming, some level of over-programming can still happen, particularly because using too many program verify operations can negatively impact overall program time. The effects of over-programming can be exacerbated on end-of-life states of a memory array, after the passage of time.

Aspects of the present disclosure address the above and other deficiencies through allowing a certain amount of over-programming of memory cells to occur while performing a fast bit erase (also referred to as a soft erase herein) before or after performing a program verify on programmed cells. Each fast bit erase can be performed on one or more individual memory cells in order to, for example, tighten the upper tail of the threshold voltage distribution, which is often the portion of the threshold voltage distribution that will later be measured during a read operation. The fast bit erase can be performed more than once, also incrementally on the one or more memory cells, to achieve a reduction of the upper tail with reference to a bit erase verify voltage associated with the threshold voltage level being erased.

In these embodiments, a memory device can include control logic coupled with a memory array to control selective fast bit erase on a particular memory cell. The memory array, for example, can include a first pillar coupled with a first data line, a second pillar coupled with a second data line, and multiple wordlines coupled with the first and second pillars. The control logic can cause the wordlines to be discharged after a program pulse is applied to program one or more memory cells coupled with a selected wordline of the multiple wordlines. The control logic can further cause a supply voltage to be applied to the second data line to cause a voltage of the second pillar to float. The control logic can further cause a ground voltage to be applied to the first data line to inhibit soft erase via the first pillar. The control logic can then cause unselected wordlines to be charged to boost channel voltages in memory cells coupled with the second pillar. The control logic can further cause one of the ground voltage or a negative voltage to be applied to the selected wordline to increase a soft erase voltage between a channel of a memory cell coupled with the second pillar and the selected wordline. In disclosed embodiments, the soft erase voltage causes a threshold voltage stored in the memory cell to be partially erased, e.g., lose some charge via the second pillar. In at least some embodiments, the threshold voltage stored in the memory cell contributes to an upper tail of one of at least two of a set of highest threshold voltage distributions of a set of the multi-level memory cells. Another variation on this approach can be employed to further perform a fast bit erase to tighten the upper tail of any threshold voltage distribution in the set of multi-level memory cells, which will be discussed in more detail.

Therefore, advantages of the systems and methods implemented in accordance with some embodiments of the present disclosure include, but are not limited to, mitigating upper tail over-program of threshold voltage distributions. For example, individual cells can be erased instead of only block-level erase. The tightening of the upper tail of threshold voltage distributions can improve RWB for better endurance or be applied to PLCs to improve programming accuracy when encoding five bit per cell. Other advantages will be apparent to those skilled in the art of programming multi-level cells discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be grouped into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO- DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLCs) can store multiple bits per cell, e.g., by way of additional threshold voltage ranges. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the control logic of the local media controller 135 can be adapted to program the memory cells via the data lines and the wordlines within the memory structures that will be discussed in more detail hereinafter. The control logic can further employ different versions of incremental programming of memory cells, including incremental step programming path (ISPP), and incremental step erasure of memory cells that have already been over-programmed. The ISPP-based programming can employ a program verify operation in between programming pulses to gradually bring the threshold voltage of a memory cell to a program verify voltage level. In some embodiments, the control logic can direct performance of incremental step erasure of memory cells to gradually (via at least one intervening erase operation) tighten an upper tail of a threshold voltage distribution until, e.g., the upper tail being within a threshold value of a bit erase verify voltage for the threshold voltage distribution. While discussion herein is related to upper tail tightening, the same or similar methods can also be employed to perform lower tail tightening.

Figure 1B:
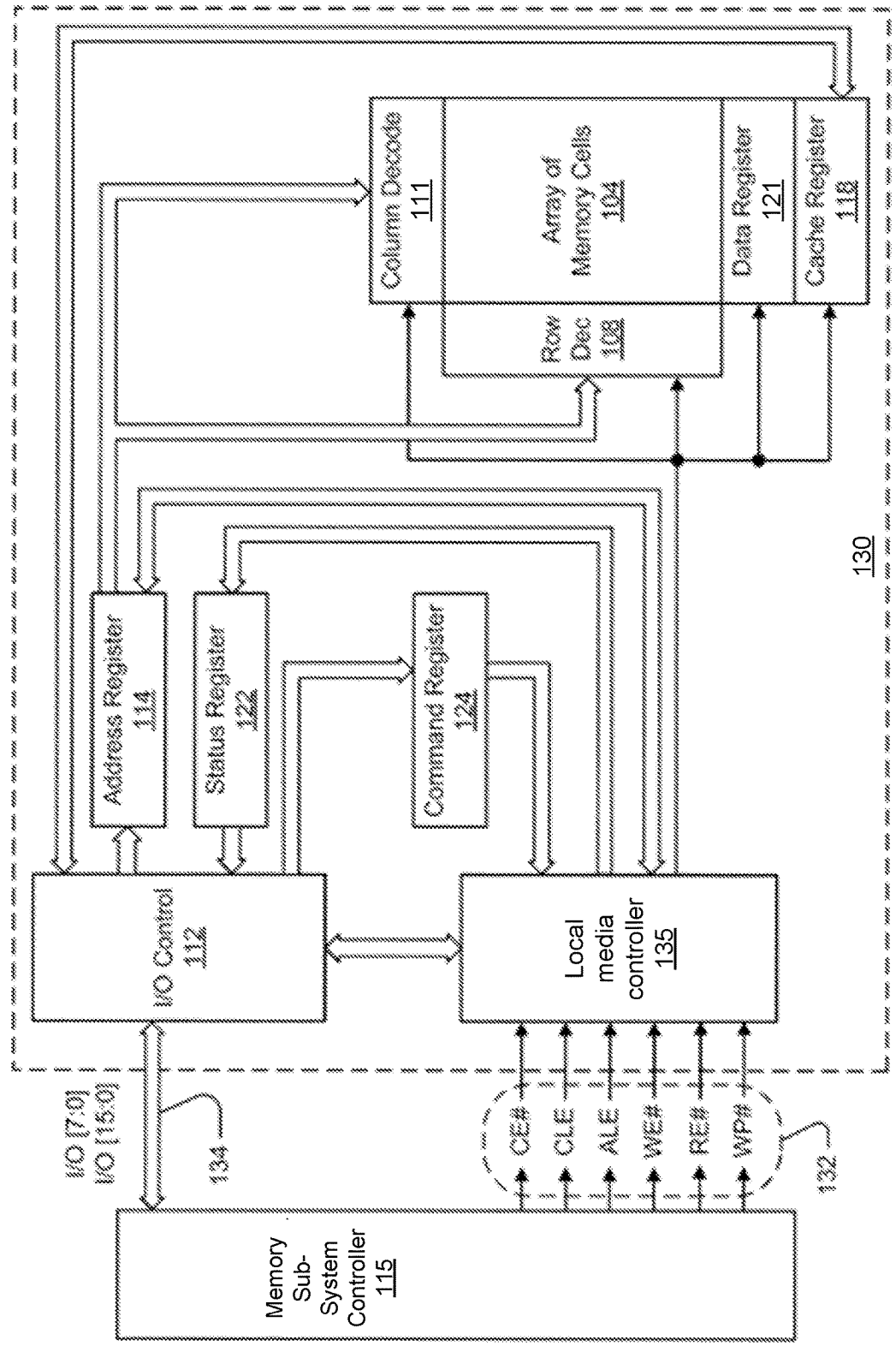
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) a page buffer of the memory device 130. The page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2:
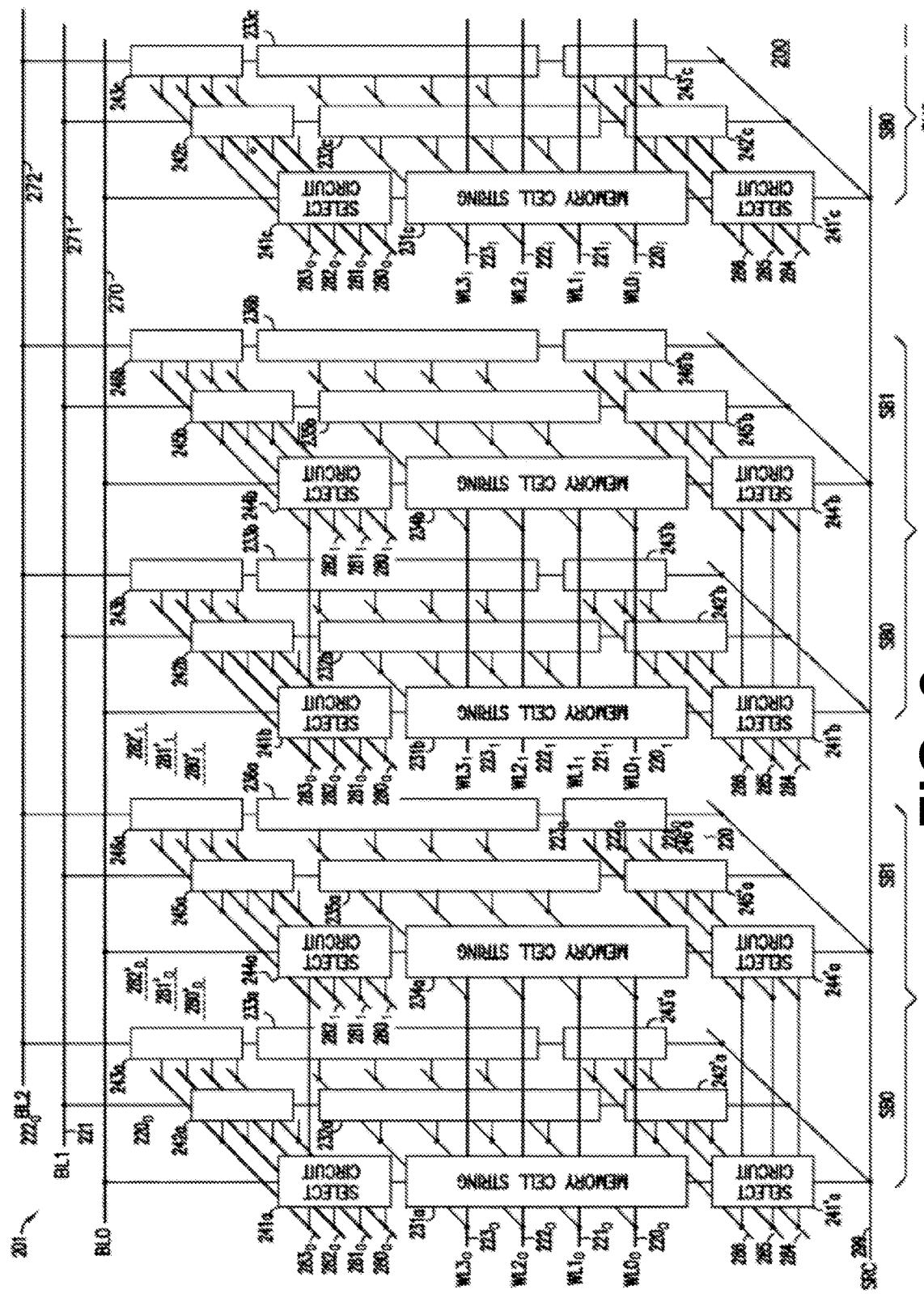
FIG. 2 is a schematic block diagram of a portion of a memory device including a memory array having memory cell strings and associated select circuits and select lines according to some embodiments.

FIG. 2 is a schematic block diagram of a portion of a memory device 200 including a memory array 201 having memory cell strings and associated select circuits and select lines according to some embodiments. Memory device 200 can correspond to memory device 130 of FIGS. 1A-1B. For example, memory array 201 can form part of the array of memory cells 104 of FIG. 1B.

As shown in FIG. 2, memory device 200 can include blocks (blocks of memory cells) BLK0, BLK1, through BLKi. Three blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately (e.g., adjacent) next to each other. For in example, in the physical structure of memory device 200, blocks BLK0 and BLK1 can be neighboring blocks.

Each of blocks BLK0, BLK1 through BLKi of memory device 200 can include (e.g., can be divided into) sub-blocks. For example, each of blocks BLK0 and BLK1 can include sub-blocks SB0 and SB1. Block BLKi can include a sub-block SB0 (and a sub-block SB1, which is not shown). Blocks BLK0, BLK1, through BLKi can include the same number of sub-blocks. FIG. 2 shows an example where each of blocks BLK0, BLK1 through BLKi can include two sub-blocks (e.g., SB0 and SB1). However, each of blocks BLK0, BLK1 through BLKi can have more than two blocks (e.g., SB0, SB1, SB2, SB3, and so on).

As shown in FIG. 2, each sub-block (e.g., SB0 or SB1) has its own memory cell strings, and each of the memory cell strings can be associated with (e.g., coupled to) select circuits. For example, sub-block SB0 of block BLK0 has memory cell strings 231$a$, 232$a$, and 233$a$ and associated select circuits (e.g., drain select circuits) 241$a$, 242$a$, and 243$a$, and select circuits (e.g., source select circuits) 241'$a$, 242'$a$, and 243'$a$. Sub-block SB1 of block BLK0 has memory cell strings 234$a$, 235$a$, and 236$a$ and associated select circuits (e.g., drain select circuits) 244$a$, 245$a$, and 246$a$, and select circuits (e.g., source select circuits) 244'$a$, 245'$a$, and 246'$a$.

Sub-block SB0 of block BLK1 has memory cell strings 231$b$, 232$b$, and 233$b$, and associated select circuits (e.g., drain select circuits) 241$b$, 242$b$, and 243$b$, and select circuits (e.g., source select circuits) 241'$b$, 242'$b$, and 243'$b$. Sub-block SB1 of block BLK1 has memory cell strings 234$b$, 235$b$, and 236$b$, and associated select circuits (e.g., drain select circuits) 244$b$, 245$b$, and 246$b$, and select circuits (e.g., source select circuits) 244'$b$, 245'$b$, and 246'$b$.

Sub-block SB0 of BLKi has memory cell strings 231$c$, 232$c$, and 233$c$, and associated select circuits (e.g., drain select circuits) 241$c$, 242$c$, and 243$c$, and select circuits (e.g., source select circuits) 241'$c$, 242'$c$, and 243'$c$. The sub-blocks of the blocks (e.g., blocks BLK0, BLK1 through BLKi) of memory device 200 can have the same number of memory cell strings and associated select circuits.

FIG. 2 shows an example of three memory cell strings and their associated circuits in a sub-block (e.g., in sub-block SB0). The number of memory cell strings and their associated select circuits in each the sub-block of blocks BLK0, BLK1, through BLKi can vary. Memory device 200 can include data lines 270, 271, and 272 that carry signals BL0, BL1, and BL2, respectively. Each of data lines 270, 271, and 272 can be structured as a conductive line (which includes conductive materials). The memory cell strings of blocks BLK0, BLK1, through BLKi can share data lines 270, 271, and 272.

For example, memory cell strings $231a$, $234a$ (of block BK0), $231b$, $234b$ (of block BLK1), and $231c$ (of BLKi) can share data line $270$. Memory cell strings $232a$, $235a$ (of block BK0), $232b$, $235b$ (of block BK1), and $232c$ (of block BLKi) can share data line $271$. Memory cell strings $233a$, $236a$ (of block BK0), $233b$, $236b$ (of block BK1), and $233c$ (of block BKi) can share data line $272$. FIG. 2 shows three data lines $270$, $271$, and $272$ as an example. The number of data lines can vary.

Memory device $200$ can include a line $299$ that can carry a signal SRC (e.g., source line signal). Line $299$ can be structured as a conductive line (which includes conductive materials) and can form part of a source (e.g., a source line) of memory device $200$. Blocks BLK0, BLK1, through BLKi can share line $299$. Alternatively, each of blocks BLK0, BLK1, through BLKi can have its own line (e.g., source) similar to line $299$.

Memory device $200$ can include access lines in blocks BLK0, BLK1 through BLKi in which the access lines are electrically separated from each other within the same block and electrically separated from block to block. As shown in FIG. 2, each of blocks BLK0, BLK1, BLK2, and BLK3 can include its own access lines associated with signals (e.g., wordline signals) WL0, WL1, WL2, and WL3. For example, in block BLK0, memory device $200$ includes access lines (which can be or can include wordlines) $220_0$, $221_0$, $222_0$, and $223_0$ (e.g., a group of access lines) that can carry corresponding signals (e.g., wordline signals) $WL0_0$, $WL1_0$, $WL2_0$, and $WL3_0$, respectively.

In block BLK1, memory device $200$ includes access lines (which can be or can include wordlines) $220_1$, $221_1$, $222_1$, and $223_1$ (e.g., a group of access lines) that can carry corresponding signals (e.g., wordline signals) $WL0_1$, $WL1_1$, $WL2_1$, and $WL3_1$, respectively. In block BLKi, memory device $200$ includes access lines (which can be or can include wordlines) $220_i$, $221_i$, $222_i$, and $223_i$ that can carry corresponding signals (e.g., wordline signals) $WL0_i$, $WL1_i$, $WL2_i$, and $WL3_i$.

Access lines $220_0$ through $223_0$, $220_1$ through $223_1$, and $220_1$ through $223_1$ can be structured as conductive access lines (which include conductive materials) that can form part of respective access lines of memory device $200$ to access memory cells in a respective block. FIG. 2 shows four access lines ($220_0$ through $223_0$, $220_1$ through $223_1$, or $220_1$ through $223_1$) in each of blocks BLK0, BLK1, through BLKi as an example. The number of access lines can vary.

In sub-block SB0 of block BK0, memory device $200$ includes select lines (e.g., drain select lines) $280_0$, $281_0$, $282_0$, and $283_0$ that can be shared by select circuits $241a$, $242a$, and $243a$. In sub-block SB1 of block BK0, memory device $200$ includes select lines (e.g., drain select lines) $280_1$, $281_1$, $282_1$, and $283_1$ that can be shared by select circuits $244a$, $245a$, and $246a$. Block BLK0 can include select lines (e.g., source select lines) $284$, $285$, and $286$ that can be shared by select circuits $241'a$, $242'a$, $243'a$, $244'a$, $245'a$, and $246'a$.

In sub-block SB0 of block BLK1, memory device $200$ includes select lines (e.g., drain select lines) $280_0$, $281_0$, $282_0$, and $283_0$ that can be shared by select circuits $241b$, $242b$, and $243b$. In sub-block SB1 of block BLK1, memory device $200$ includes select lines (e.g., drain select lines) $280_1$, $281_1$, $282_1$, and $283_1$ that can be shared by select circuits $244b$, $245b$, and $246b$. Block BLk1 can include select lines (e.g., source select lines) $284$, $285$, and $286$ that can be shared by select circuits $241'b$, $242'b$, $243'b$, $244'b$, $245'b$, and $246'b$. In sub-block SB0 of block BLKi, memory device $200$ includes select lines (e.g., drain select lines) $280_0$, $281_0$, $282_0$, and $283_0$ that can be shared by select circuits $241c$, $242c$, and $243c$; and select lines (e.g., source select lines) $284$, $285$, and $286$ that can be shared by select circuits $241'c$, $242'c$, and $243'c$.

FIG. 2 shows an example where memory device $200$ includes four drain select lines (e.g., $280_0$, $281_0$, $282_0$, and $283_0$) associated with a drain select circuit (e.g., $241a$, $242a$, or $243a$) in a sub-block (e.g., sub-block SB0 of block BLK0). However, memory device $200$ can include fewer or more than four drain select lines associated with a drain select circuit. Similarly, FIG. 2 shows an example where memory device $200$ includes three source select lines (e.g., $284$, $285$, and $286$) associated with a source select circuit (e.g., $241'a$, $242'a$, or $243'a$) in a sub-block (e.g., sub-block SB0 of block BLK0). However, memory device $200$ can include fewer or more than three source select lines associated with a source select circuit.

Memory device $200$ can include connections $280'_0$, $281'_0$, $282'_0$, $283'_0$, $280'_1$, $281'_1$, $282'_1$, $283'_1$, where each of which can electrically connect two respective select lines. FIG. 2 shows connections $280'_0$, $281'_0$, $282'_0$, $283'_0$, $280'_1$, $281'_1$, $282'_1$, $283'_1$ by themselves to avoid crowding the elements shown in FIG. 2. FIG. 2 shows a connection $280'_0$ to indicate select line $280_0$ of sub-block SB0 of block BLK0 (sometimes referred to as select line $280_0$/SB0/BLK0) and select line $280_0$ of sub-block SB0 of block BLK1 (sometimes referred to as select line $280_0$/SB0/BLK1) can be in electrical contact (e.g., can be electrically connected) to each other through connection $280'_0$. Thus, in memory device $200$, select lines $280_0$/SB0/BLK0 and $280_0$/SB0/BLK1 can be provided (e.g., applied) with the same signal. This also means that select lines $280_0$/SB0/BLK0 and $280_0$/SB0/BLK1 can receive the same signal during an operation (e.g., read, write, or erase operation) of memory device $200$.

FIG. 2 shows a connection $281'_0$ to indicate select line $281_0$ of sub-block SB0 of block BLK0 (sometimes referred to as select line $281_0$/SB0/BLK0) and select line $281_0$ of sub-block SB0 of block BLK1 (sometimes referred to as select line $281_0$/SB0/BLK1) can be in electrical contact (e.g., can be electrically connected) to each other through connection $281'_0$. Thus, in memory device $200$, select lines $281_0$/SB0/BLK0 and $281_0$/SB0/BLK1 can be provided (applied) with the same signal. This also means that select lines $281_0$/SB0/BLK0 and $281_0$/SB0/BLK1 can receive the same signal during an operation (e.g., read, write, or erase operation) of memory device $200$.

FIG. 2 shows a connection $282'_0$ to indicate select line $282_0$ of sub-block SB0 of block BLK0 (sometimes referred to as select line $282_0$/SB0/BLK0) and select line $282_0$ of sub-block SB0 of block BLK1 (sometimes referred to as select line $282_0$/SB0/BLK1) can be in electrical contact (e.g., can be electrically connected) to each other through connection $282'_0$. Thus, in memory device $200$, select lines $282_0$/SB0/BLK0 and $282_0$/SB0/BLK1 can be provided (applied) with the same signal. This also means that select lines $282_0$/SB0/BLK0 and $282_0$/SB0/BLK1 can receive the same signal during an operation (e.g., read, write, or erase operation) of memory device $200$.

FIG. 2 shows a connection $283'_0$ to indicate select line $283_0$ of sub-block SB0 of block BLK0 (sometimes referred to as select line $283_0$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_0$. Thus, in memory device $200$, select lines $283_0$/SB0/BLK0 and $283_1$/SB0/BLK0 can be provided (applied) with the same signal. This also means that select lines $283_0$/SB0/BLK0 and $283_1$/SB0/BLK1 can receive the same signal during an operation (e.g., read, write, or erase operation) of memory device 200.

FIG. 2 shows a connection $280'_1$ to indicate select line $280_1$ of sub-block SB1 of block BLK0 (sometimes referred to as select line $280_1$/SB1/BLK0) and select line $280_1$ of sub-block SB1 of block BLK1 (sometimes referred to as select line $280_1$/SB1/BLK1) can be in electrical contact (e.g., can be electrically connected) to each other through connection $281'_1$. Thus, in memory device 200, select lines $280_1$/SB1/BLK0 and $280_1$/SB1/BLK1 can be provided (applied) with the same signal. This also means that select lines $280_1$/SB1/BLK0 and $280_1$/SB1/BLK1 can receive the same signal during an operation (e.g., read, write, or erase operation) of memory device 200.

FIG. 2 shows a connection $281'_1$ to indicate select line $281_1$ of sub-block SB1 of block BLK0 (sometimes referred to as select line $281_1$/SB1/BLK0) and select line $281_1$ of sub-block SB1 of block BLK1 (sometimes referred to as select line $281_1$/SB1/BLK1) can be in electrical contact (e.g., can be electrically connected) to each other. Thus, in memory device 200, select lines $281_1$/SB1/BLK0 and $281_1$/SB1/BLK1 can be provided (applied) with the same signal. This also means that select lines $281_1$/SB1/BLK0 and $281_1$/SB1/BLK1 can receive the same signal during an operation (e.g., read, write, or erase operation) of memory device 200.

FIG. 2 shows a connection $282'_1$ to indicate select line $282_1$ of sub-block SB1 of block BLK0 (sometimes referred to as select line $282_1$/SB1/BLK0) and select line $282_1$ of sub-block SB1 of block BLK1 (sometimes referred to as select line $282_1$/SB1/BLK1) can be in electrical contact (e.g., can be electrically connected) to each other through connection $282'_1$. Thus, in memory device 200, select lines $282_1$/SB1/BLK0 and $282_1$/SB1/BLK1 can be provided (applied) with the same signal. This also means that select lines $282_1$/SB1/BLK0 and $282_1$/SB1/BLK1 can receive the same signal during an operation (e.g., read, write, or erase operation) of memory device 200.

FIG. 2 shows a connection $283'_1$ to indicate select line $283_1$ of sub-block SB0 of block BLK0 (sometimes referred to as select line $283_1$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_1$. Thus, in memory device 200, select lines $283_1$/SB0/BLK0 and $283_1$/SB0/BLK0 can be provided (applied) with the same signal. This also means that select lines $283_1$/SB0/BLK0 and $283_1$/SB0/BLK0 can receive the same signal during an operation (e.g., read, write, or erase operation) of memory device 200.

In the structure of memory device 200, each of connections $280'_0$, $281_0$, $282'_0$, $283'_0$, $280'_1$, $281_1$, $282'_1$, $283'_1$ can include a conductive material that is formed to be in electrical contact with the materials of two respective select lines. For example, connection $283'_0$ can include a conductive material that is formed to be in electrical contact with the material that form select lines $283_0$/SB0/BLK0 and the material that form select line $283_1$/SB0/BLK0. In another example, connection $282'_0$ can include a conductive material that is formed to be in electrical contact with the material that forms select lines $282_0$/SB0/BLK0 and the material that form select line $282_1$/SB0/BLK0.

The material (or materials) of each of connection $280'_0$, $281_0$, $282'_0$, $283'_0$, $280'_1$, $281_1$, $282'_1$, $283'_1$ can include metal, doped polysilicon, or other conductive materials. Each of the drain select circuits of memory device 200 can include multiple drain select gates connected in series (e.g., four transistors connected in series) between a respective data line and a respective memory cell string. The drain select gates can be controlled (e.g., turned on or turned off) by respective drain select lines based on voltages provided to the signals on the respective drain select lines. Each of the source select circuits of memory device 200 can include multiple source select gates connected in series between line 299 and a respective memory cell string. The source select gates can be controlled (e.g., turned on or turned off) by respective source select lines based on voltages provided to the signals on the respective source select lines.

In FIG. 2, each of the memory cell strings of memory device 200 has memory cells arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines 270, 271, or 272). When a particular source select circuit is activated, it can electrically connect (e.g., form a current path from) a selected memory cell string associated with that particular select circuit to a source (e.g., line 299).

Figure 3:
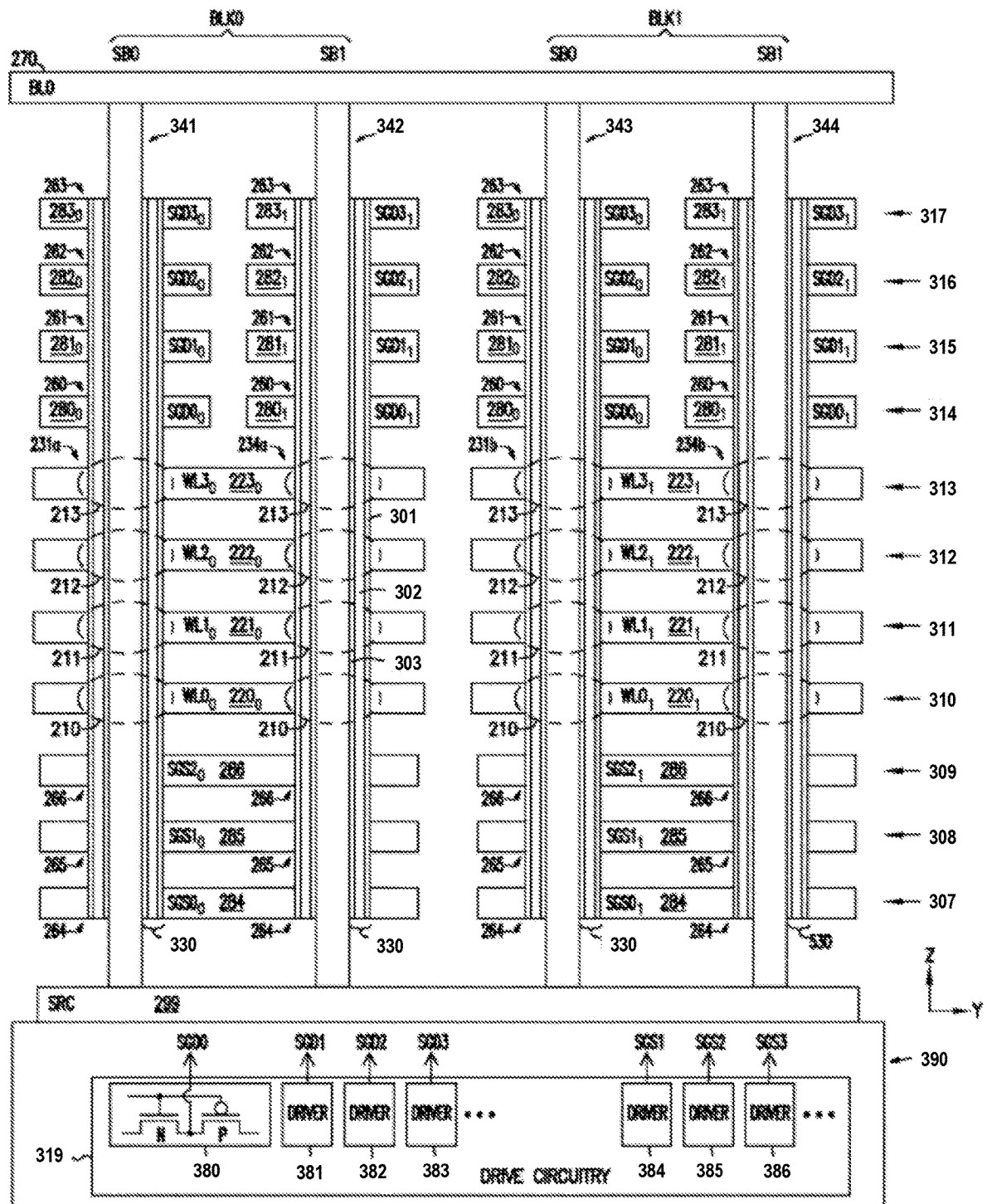
FIG. 3 is a side view of a structure of a portion of the memory device of FIG. 2, according to some embodiments.

FIG. 3 is a side view of a structure of a portion of the memory device 200 of FIG. 2, according to some embodiments. As shown in FIG. 3, memory device 200 can include a substrate 390 over which memory cells 210, 211, 212, and 213 of memory cell strings 231a, 234a, 231b, and 234b of respective sub-blocks SB0 and SB1 of blocks BLK0 and BLK1 can be formed (e.g., formed vertically in z-direction with respect to line 299 and substrate 390). Memory device 200 includes different levels 307 through 317 with respect to a z-direction. Levels 307 through 317 are internal device levels between substrate 390 and data line 270.

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type).

Memory device 200 can include drive circuitry 319 to provide signals (e.g., drain and source select line signals) to respective select lines of memory device 200. Drive circuitry 319 can correspond to or be included in the local media controller 135 of FIGS. 1A-1B. Although not shown in FIG. 3, substrate 390 can include circuitry that can be located directly under line 299. Such circuitry can include sense amplifiers, buffers (e.g., page buffers), decoders, and other circuit components of memory device 200. As shown in FIG. 3, drive circuitry 319 can include drivers (driver circuits) 380, 381, 382, and 383 to provide respective signals (e.g., drain select line signals SGD0, SGD1, SGD2, and SGD3), and drivers (driver circuits) 384, 385, and 386 to provide respective signals (e.g., source select line signals SGS0, SGS1, and SGS2). In FIG. 3, only some of the drain and source select signals are shown for simplicity.

In FIG. 3, each of drivers 380 through 386 can include two transistor N (e.g., NMOS) and P (e.g., p-channel MOS (PMOS)). For simplicity, detail of only one of drivers 380 through 384 is shown in FIG. 3. Each of drivers 380 through 386 can include an output node, e.g., a node located between and electrically connected to transistors N and P, to provide (e.g., drive) a respective signal (e.g., a drain select line signal or a source select line signal). The output node of each of drivers 380 through 386 can be coupled to (e.g., electrically connected to) a respective drain select line or a respective source select line of memory device 200. This allows the drain and source select line signals (e.g., SGD0, SGD1, SGD2, SGD3, SGS0, SGS1, and SGS2) from drive circuitry 319 to be provided to respective drain and source select lines of memory device 200 as described above with reference to FIG. 2 and FIG. 3.

FIG. 3 shows an example where each of drivers 380 through 386 can have two transistors of different transistor types (e.g., NMOS and PMOS) coupled in a complementary MOS (CMOS) connection. However, each of drivers 380 through 386 can have two transistors of the same types (e.g., two NMOS transistors or two PMOS transistors) and two separate transistor gate signals. Further, the number of transistors in each of drivers 380 through 386 may be different from two.

As shown in FIG. 3, data line 270 can have a length extending in the y-direction (e.g., shown in FIG. 3), which is perpendicular to the z-direction and the x-direction. Data line 270 can include a conductive material (e.g., conductively doped polycrystalline silicon (doped polysilicon), metals, or other conductive materials). Further, line 299 can include a conductive material and can have a length extending in the y-direction. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390).

In at least some embodiments, select lines (e.g., drain select lines) $280_0$, $281_0$, $282_0$, and $283_0$ of each of blocks BLK0 and BLK1 can be located in respective levels 314, 315, 316, and 317. Select lines (e.g., drain select lines) $280_1$, $281_1$, $282_1$, and $283_1$ of each of blocks BLK0 and BLK1 can be located in respective levels 314, 315, 316, and 317.

In at least some embodiments, memory cells 210, 211, 212, and 213 of memory cell strings 231a, 234a, 231b, and 234b can be located in levels 310, 311, 312, and 313, respectively. Access lines $220_0$, $221_0$, $222_0$, and $223_0$ (associated with memory cells 210, 211, 212, and 213, respectively) of block BLK0 can be located in levels 310, 311, 312, and 313, respectively. Access lines $220_1$, $221_1$, $222_1$, and $223_1$ (associated with memory cells 210, 211, 212, and 213, respectively) of block BLK1 can be located in levels 310, 311, 312, and 313, respectively.

Select lines (e.g., source select lines) 284, 285, and 286 of each of blocks BLK0 and BLk1 can be located in different levels (e.g., levels 307, 308, and 309, respectively) between substrate 390 and memory cell strings 231a, 232a, and 233a. Memory device 200 can also include dielectric materials (not labeled in FIG. 3) interleaved with other elements in different levels of memory device 200. For example, memory device 200 can include dielectric materials (e.g., silicon dioxide) located between levels 314 and 317 and interleaved with (located in the spaces between) select lines $280_0$, $281_0$, $282_0$, and $283_0$ of each of blocks BLK0 and BLK1. In another example, memory device 200 can include a group of dielectric materials (e.g., silicon dioxide) located between levels 310 and 313 and interleaved with (located in the spaces between) access lines $220_0$, $221_0$, $222_0$, and $223_0$ of block BLK0. In another example, memory device 200 can include a group of dielectric materials (e.g., silicon dioxide) located between levels 310 and 313 and interleaved with (located in the spaces between) access lines $220_1$, $221_1$, $222_1$, and $223_1$ of block BLK1.

In another example, memory device 200 includes dielectric materials (e.g., silicon dioxide) located between levels 307 and 309 and interleaved with (located in the spaces between) select lines 284, 285, and 286. The materials of select lines $280_0$, $281_0$, $282_0$, $283_0$, $280_1$, $281_1$, $282_1$, $283_1$, 284, 285, and 286 can include conductively doped polycrystalline silicon, metals, or other conductive materials and can be the same as the conductive material of access lines $220_0$, $221_0$, $222_0$, $223_0$, $220_1$, $221_1$, $222_1$, and $223_1$. As shown in FIG. 3, memory device 200 can include pillars (conductive pillars) pillars 341, 342, 343, and 344 in respective sub-blocks SB0 and SB1 of blocks BLK0 and BLK1. Each of pillars 341, 342, 343, and 344 can have length extending outwardly (e.g., vertically in the direction of the z-direction and perpendicular to the y-direction). Each of pillars 341, 342, 343, and 344 can contact a conductive region of the material that forms part of data line 270 and contact a conductive region of the material that forms part of line 299.

Each of pillars 341, 342, 343, and 344 can include a material (or materials) to form a conductive path (e.g., a channel) between data line 270 and line 299. Such a material (e.g., undoped or doped polycrystalline silicon) of each of pillars 341, 342, 343, and 344 can be part of a channel (not shown in FIG. 3) of a respective pillar among pillars 341, 342, 343, and 344.

As shown in FIG. 3, memory device 200 can include a structure 330 adjacent a respective pillar of pillars 341, 342, 343, and 344 and extending continuously along a length of the respective pillar. Structure 330 is also adjacent portions of respective access lines ($220_0$, $221_0$, $222_0$, and $223_0$, or access lines $220_1$, $221_1$, $222_1$, and $223_1$). Structure 330 adjacent a respective pillar is located between the respective pillar and portions of respective access lines (access lines $220_0$, $221_0$, $222_0$, and $223_0$, or access lines $220_1$, $221_1$, $222_1$, and $223_1$). Structure 330 can include portions 301, 302, and 303. Parts of structure 330 along a particular pillar can form part of each of memory cells of the memory cell string adjacent that particular pillar. For example, structure 330 adjacent pillar 342 can form part of each of memory cells 210, 211, 212, and 213 of memory cell string 234a. Thus, each of memory cells 210, 211, 212, and 213 of a memory cell string can include part of structure 330 (part of each of portions 301, 302, and 303) located directly between one of the access lines (one of access lines $220_0$, $221_0$, $222_0$, and $223_0$, $220_1$, $221_1$, $222_1$, and $223_1$) and a respective pillar. For example, memory cell 212 of memory cell string 243a (adjacent pillar 342) can include part of each of portions 301, 302, and 303 located directly between access line 222o and pillar 342.

Structure 330 can be part of a TANOS (TaN, $Al_2O_3$, $Si_3N_4$, $SiO_2$, Si) structure. For example, portion 301 (e.g., interpoly dielectrics) can include a charge blocking material or materials (e.g., a dielectric material such as TaN and $Al_2O_3$) that are capable of blocking a tunneling of a charge. Portion 302 can include a charge storage element (e.g., charge storage material or materials, such as $Si_3N_4$) that can provide a charge storage function (e.g., trap charge) to represent a value of information stored in memory cells 210, 211, 212, or 213. Portion 303 can include a dielectric, such as a tunnel dielectric material or materials (e.g., $SiO_2$) that are capable of allowing tunneling of a charge (e.g., electrons). As an example, portion 303 can allow tunneling of electrons from portion 304 to portion 302 during a write operation and tunneling of electrons from portion 302 to portion 304 during an erase operation of memory device 200. Moreover, portion 303 can allow tunneling of holes from portion 304 to portion 302, compensating the trapped electron recombination during an erase operation of memory device 200. In an alternative arrangement of memory device 200, structure 330 can be part of a SONOS (Si, $SiO_2$, $Si_3N_4$, $SiO_2$, Si) structure. In another alternative arrangement, structure 330 can be part of a floating gate structure (e.g., portion 302 can be polysilicon and each of portions 301 and 303 can be dielectric (e.g., $SiO_2$).

As shown in FIG. 3, a select line (e.g., $280_0$) is a piece (e.g., a single layer) of conductive material (e.g., polycrystalline silicon, metal, or other conductive materials). As described above, a select line can carry a signal (e.g., signal $SGD1_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor). For example, in FIG. 3, select gate 260 of sub-block SB0 of block BLK0 can include a portion of select line $280_0$ sub-block SB0 of block BLK0 and a portion of structure 330 (along pillar 341) adjacent select line $280_0$ of sub-block SB0 of block BLK0. In another example, select gate 261 of sub-block SB0 of block BLK0 can include a portion of select line $281_0$ sub-block SB0 of block BLK0 and a portion of structure 330 (along pillar 341) adjacent select line $281_0$ of sub-block SB0 of block BLK0.

FIG. 3 shows an example where select gates 261 through 266 have the same structure (e.g., TANOS structure) as memory cells 210, 211, 212, and 213. Alternatively, select gates 260, 261, 262, and 263 (e.g., drain select gate), select gates 264, 265, and 266 (e.g., source select gate), or select gates 260 through 266 can have a different structure, such as a FET structure. As is known to those skilled in the art, an FET usually includes a transistor gate, a transistor body channel, and a gate oxide between the transistor gate and the transistor body channel that can be in direct contact with the transistor gate and the transistor body channel.

Figure 4:
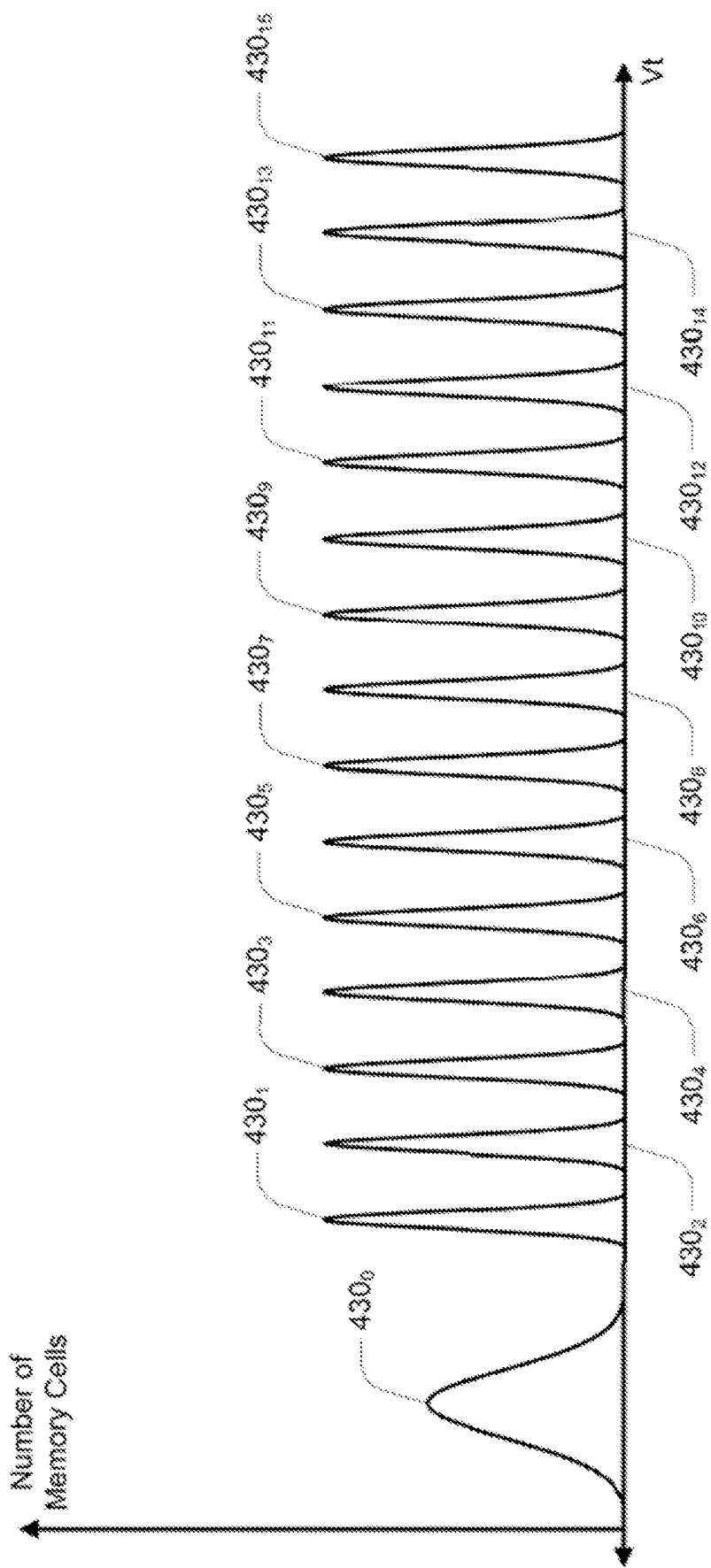
FIG. 4 is a conceptual depiction of threshold voltage distributions of multiple memory cells of a memory array according to an embodiment

FIG. 4 is a conceptual depiction of threshold voltage ranges of multiple memory cells. FIG. 4 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ can tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$, and $430_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case can be storing a data state L0 having a data value of logical '1111' and is typically referred to as the erased state of the memory cell. If the threshold voltage is within the second of the sixteen threshold voltage ranges $430_1$, the memory cell in this case can be storing a data state L1 having a data value of logical '0111'. If the threshold voltage is within the third of the sixteen threshold voltage ranges $430_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5B:
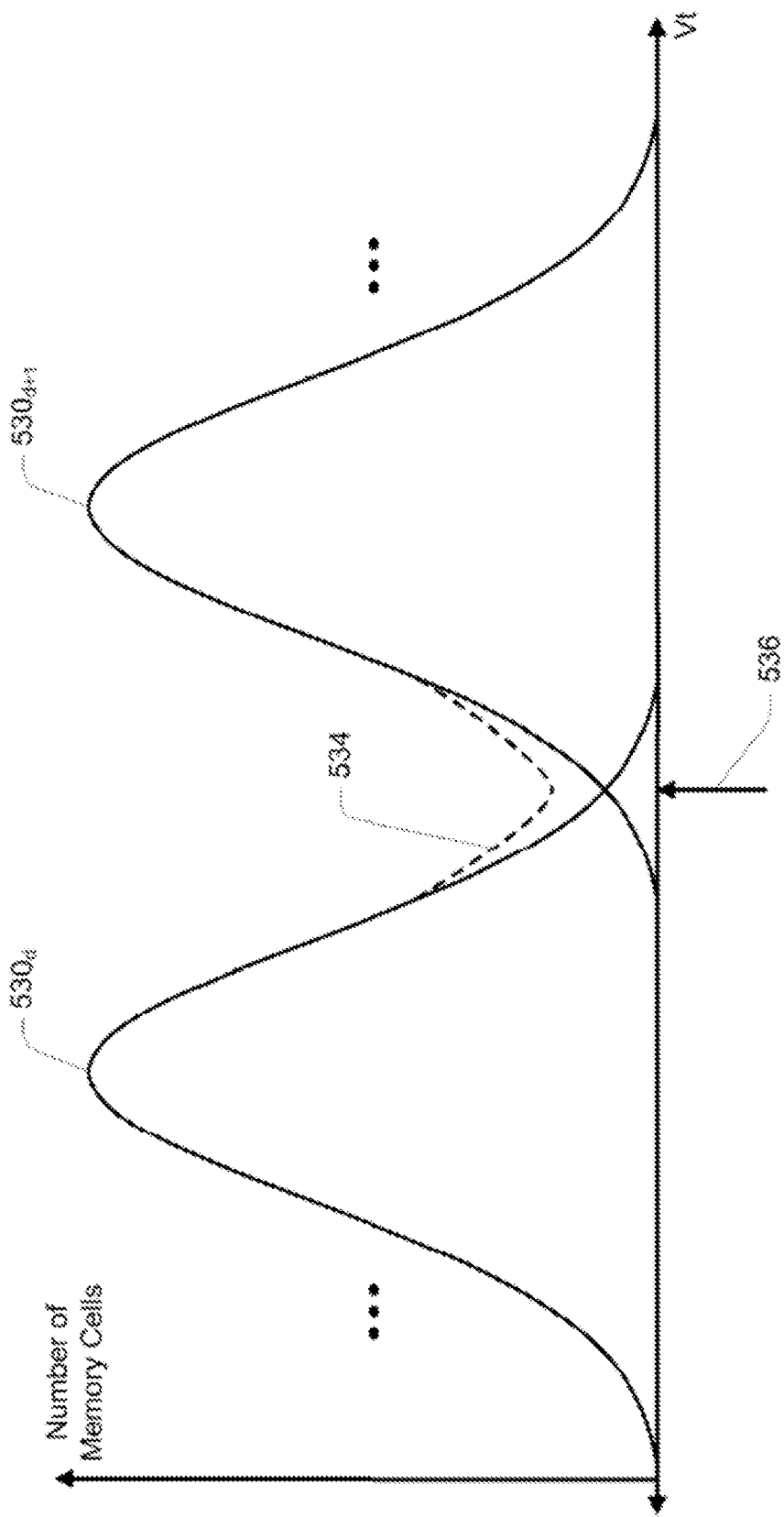

FIG. 5A is a conceptual depiction of threshold voltage distributions of multiple memory cells following (e.g., immediately following) a programming operation, while FIG. 5B is a conceptual depictions of those same threshold voltage distributions at some later time following that programming operation. The threshold voltage distributions $530_d$-$530_{d+1}$ of FIG. 5A and FIG. 5B can represent some portion of the distributions for threshold voltage ranges $430_0$-$430_{15}$ of FIG. 4 at the completion of a programming operation for memory cells.

With reference to FIG. 5A, adjacent threshold voltage distributions 530 are typically separated by some margin 532 (e.g., dead space) at the completion of programming. Applying a sense voltage (e.g., read voltage) within the margin 532 to the control gates of the plurality of memory cells can be used to distinguish between the memory cells of the threshold voltage distribution $530_d$ (and any lower threshold voltage distribution) and the memory cells of the threshold voltage distribution $530_{d+1}$ (and any higher threshold voltage distribution), conceivably without error.

With reference to FIG. 5B, adjacent threshold voltage distributions can have widened, such that the threshold voltage distribution $530_d$ and the threshold voltage distribution $530_{d+1}$ can merge (or overlap) as represented by the curve 534 indicating a sum of the two adjacent threshold voltage distributions. The curve 534 can have a local minima 536. Where such merging of adjacent threshold voltage distributions occurs, distinguishing between memory cells intended to be in the threshold voltage distribution $530_d$ and memory cells intended to be in the threshold voltage distribution $530_{d+1}$ will generally result in some error. For example, applying a sense voltage, having a voltage level corresponding to the local minima 536, to the control gates of the plurality of memory cells can be expected to produce the least number of memory cells having a data state other than their target (e.g., intended) data state, but a certain number of errors would generally be inevitable. Applying a sense voltage higher or lower than the voltage level corresponding to the local minima 536 can be expected to produce larger numbers of errors. While applying a sense voltage having the voltage level corresponding to the local minima 536 of the curve 534 can produce the least number of errors, it can be difficult to determine at what voltage level this local minima 536 occurs.

Figure 6:
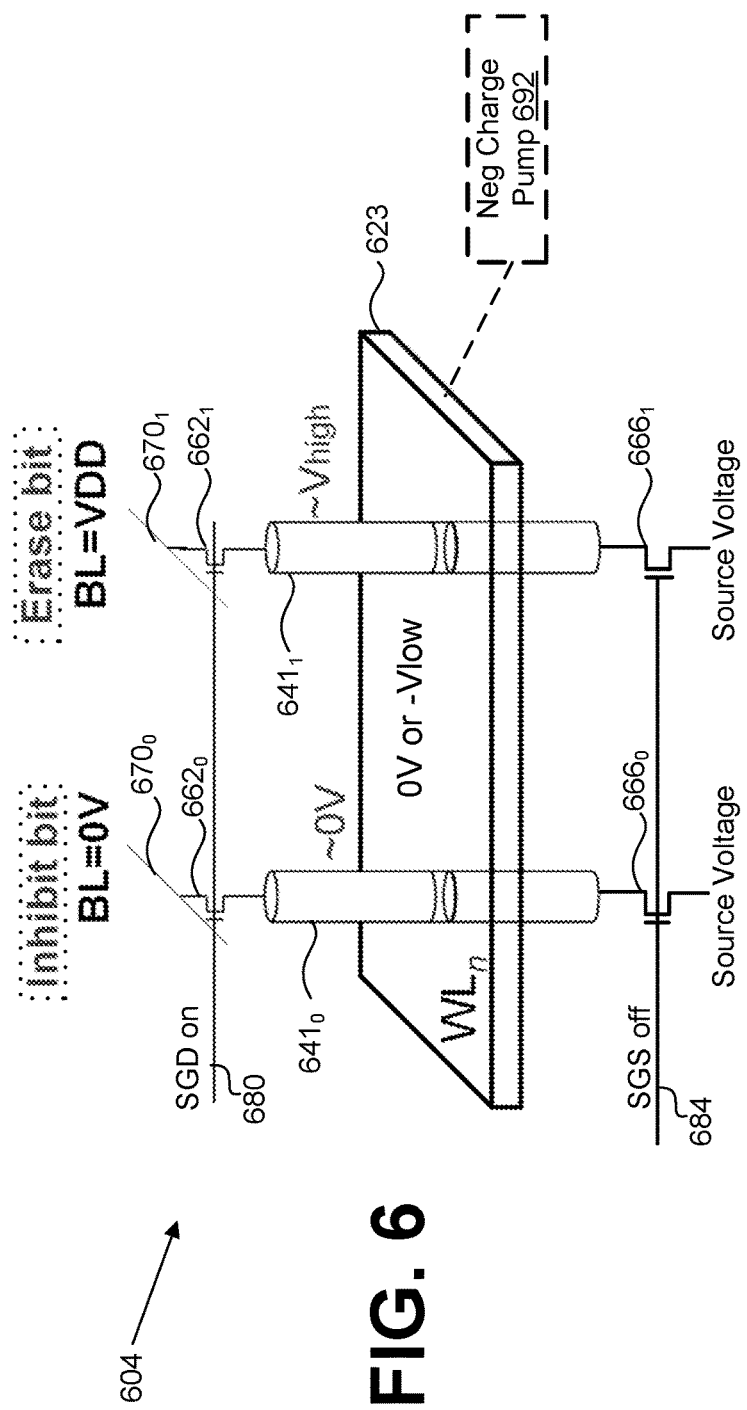
FIG. 6 is a simplified perspective, zoomed-in view of two pillars and a selected wordline according to an embodiment.

FIG. 6 is a simplified perspective, zoomed-in view of two pillars and a selected wordline according to an embodiment. For example, a memory array 604 can include a first data line $670_0$ and a first pillar $641_0$ coupled with the first data line $670_0$. The memory array 604 can further include a second data line $670_1$ and a second pillar $641_1$ coupled with the second data line $670_1$. The memory array 604 can further include multiple wordlines coupled with the first pillar $641_0$ and the second pillar $641_0$, only a selected wordline 623 (e.g., WLn) of which is illustrated to simplify the explanation. As illustrated in FIG. 3, however, the memory array 604 can include many pillars and many coupled wordlines between which are coupled multiple memory cells, e.g., in groups of strings of memory cells.

In at least some embodiments, to selectively erase a memory cell, the control logic (e.g., of the local memory controller 135) causes the first data line $670_0$ to be coupled with ground (e.g., to 0V) to inhibit the first pillar $641_0$ from floating, and causes the second data line $670_1$ to be coupled with a high voltage, Vhigh (e.g., to Vdd) to cause a voltage of the second pillar $641_1$ to float. Concurrently, the control logic can cause unselected wordlines to be charged to boost channel voltages of the second pillar $641_1$. FIG. 3 illustrates many wordlines $220_0$-$223_0$, and thus, all but one of these wordlines would be considered "unselected." Further, the control logic can cause one of the ground voltage (e.g., 0V) or a negative voltage (e.g., –Vlow, such as between –1V to –2.5V) to be applied to the selected wordline 623 while the second pillar $641_1$ voltage is kept at the high voltage due to a high pillar capacitance. One pillar can connect up to tens or hundreds of NAND cells in a vertical direction, so one WL discharge does not affect pillar voltage too much. Further, the selected cell will have a high erase polarity voltage, e.g., a high soft erase voltage between a channel of the selected cell and the selected wordline.

In various embodiments, causing one of the ground voltage or the negative voltage to be applied to the selected wordline 623 can include causing the selected wordline 623 to be charged together with causing the unselected wordlines to be charged, and once the unselected wordlines have been charged, causing the selected wordline to be discharged until the ground voltage or the negative voltage is applied. If the negative voltage is applied, an optional negative charge pump 692 can be used to reduce the voltage level on the selected wordline 623.

In at least some embodiments, because the channel voltage of the memory cell coupled between the selected wordline 623 and the second pillar $641_1$ is at an erase polarity, the erase polarity causes the threshold voltage (e.g., Vt charge) stored in the memory cell to be partially erased via the second pillar $641_1$, e.g., a soft erase occurs. In one embodiment, the control logic can further cause the memory cell or another memory cell coupled with the selected wordline 623 to be erased in incremental step erasure until an upper tail of a threshold voltage distribution is within a threshold value of a bit erase verify voltage.

Figure 7:
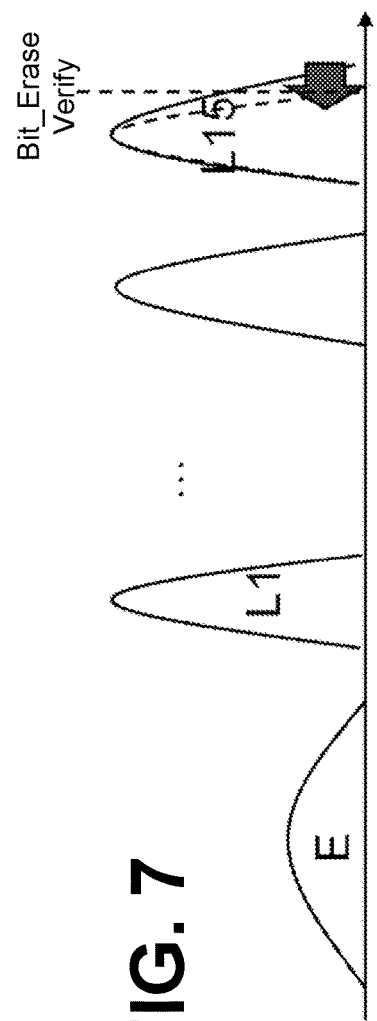
FIG. 7 is a graph illustrating fast bit erase of an upper tail of one of a set of highest threshold voltage distributions according to an embodiment.

In performing erasure of the memory cell, the soft erase stress between the first pillar $641_1$ and the selected wordline 623 can be Vhigh–(–Vlow), or in other words, Vhigh+Vlow. So, only for purposes of explanation, if Vhigh is about 8V and –Vlow is about –2V, then the soft erase stress on the memory cell would be about 10V. FIG. 7 is a graph illustrating fast bit erase of an upper tail of one of a set of highest threshold voltage distributions according to an embodiment, e.g., of L15 in a QLC. A soft erase stress or voltage would be sufficient to erase one of at least two of the highest threshold voltage distributions of multi-level memory cells such as L6 or L7 in TLCs and L14 or L15 in QLCs.

In these embodiments, the memory array 604 further includes a first drain select transistor $662_0$ coupled with the first pillar $641_0$ and a second drain select transistor $662_1$ coupled with the second pillar $641_1$. The memory array 604 can further include a drain select gate line 680 coupled with gates of the first drain select transistor $662_0$ and the second drain select transistor $662_1$. The control logic can then perform an operation, which is part of the bit erase procedure, that includes sending a drain select signal to the drain select gate line 680 to turn on the first drain select transistor $662_0$ and the second drain select transistor $662_1$.

Further in these embodiments, the memory array 604 includes a first source select transistor $666_0$ coupled with the first pillar $641_0$ and a second source select transistor $666_1$ coupled with the second pillar $641_1$. The memory array 604 can further include a source select gate line 684 coupled with gates of the first source select transistor $666_0$ and the second source select transistor $666_1$. The control logic can then perform an operation, which is part of the bit erase procedure, that includes sending a source select signal to the source select gate line 684 to turn off the first source select transistor $666_0$ and the second source select transistor $666_1$.

In at least one embodiment, causing the threshold voltage stored in the memory cell to be erased occurs after the program pulse and after a program verify is performed on the memory cell. In at least another embodiment, causing the threshold voltage stored in the memory cell to be erased occurs between the program pulse and the program verify being performed on the memory cell, for example.

Figures 8, 9:
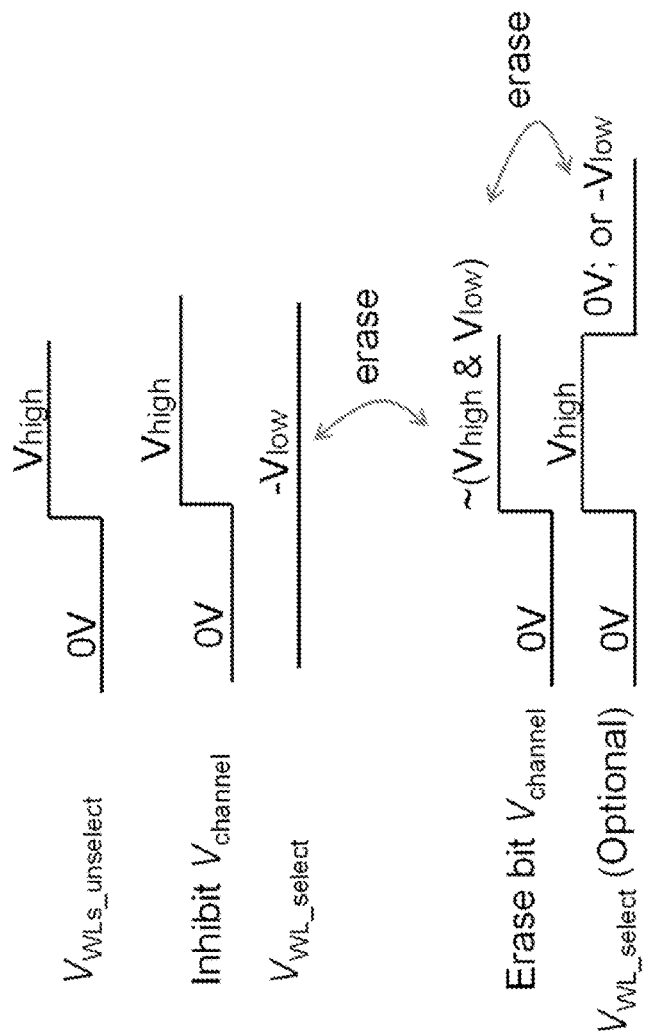
FIG. 8 is a graph illustrating waveforms associated with performing a bit erase according to an embodiment.
FIG. 9 is a flow diagram illustrating operations executable to perform the fast bit erase according to an exemplary embodiment.

FIG. 8 is a graph illustrating waveforms associated with performing a bit erase according to an embodiment, e.g., as was just discussed with reference to FIGS. 6-7. The waveforms include a first waveform for unselected wordlines ($V_{WLs\_unselect}$), which transition from a ground voltage (e.g., 0V) to a high voltage, e.g., Vhigh, which can be ~10V, for example. The second waveform illustrates an inhibit voltage ($V_{channel}$) in the first pillar $641_0$, which transitions also from a ground voltage to the high voltage (Vhigh). The third waveform is for the selected wordline ($V_{WL\_select}$) illustrates that the selected wordline remains at ground voltage or is pushed to a negative voltage, e.g., –Vlow. The fourth waveform is for a soft erase voltage (erase bit $V_{channel}$) of the second pillar $641_1$, which transitions from the ground voltage to the high voltage plus the negative voltage, e.g., about Vhigh plus Vlow, which can be ~12V, for example. In one embodiment, the soft erase voltage is ~10V. The last waveform is an optional waveform for the selected wordline ($V_{WL\_select}$), which can also go high with the unselected wordlines before being discharged to 0V or a negative voltage, e.g., -Vlow.

FIG. 9 is a flow diagram 900 illustrating operations executable to perform the fast bit erase according to an exemplary embodiment. For example, these operations can be performed to perform bit erasure between the program pulse and the program verify being performed on the memory cell. In various embodiments, the operations are illustrated and described while referencing unselected wordlines (WLn−1, WLn−2, etc.) that are located below a selected wordline (WLn) and are programmed prior to the selected wordline (WLn), the selected wordline (WLn) by itself, and wordlines (WLn+1, WLn+2, etc.) that are located above the selected wordline (WLn) and are to be programmed after WLn. There is also an option to program the WLs from top to bottom. If so, one can still refer to WLn−1, WLn−2, etc. as programmed WLs prior to the selected wordline (WLn), but they will be positioned on top of the selected wordline (WLn). Accordingly, the n−1, n−2, WLs can be swapped with the n+1, n+2, . . . WLs in some embodiments.

In at least some embodiments, during a first operation (e.g., Op_1), the control logic causes all wordlines (WLs) coupled with the first pillar $641_0$ and the second pillar $641_1$ to be discharged. During a second operation (e.g., Op_2), the control logic can assert the drain select gate line 680 (e.g., turning on the first drain select transistor $662_0$ and the second drain select transistor $662_1$), which passes a supply voltage on the second data line $670_1$ to the second pillar $641_1$ and passes a ground voltage on the first data line $670_0$ to the first pillar $641_0$. In disclosed embodiments, this supply voltage causes a voltage of the second pillar $641_1$ to float and the ground voltage inhibits soft erase via the first data line $670_0$ and the first pillar $641_0$.

In at least some embodiments, during a third operation (e.g., Op_3), the control logic can cause the unselected wordlines (WLn−1) positioned below the selected wordline (WLn) to be charged to either the high voltage (e.g., Vhigh, which can be between 8-10V) or to be retained at ground voltage (e.g., 0V). Concurrently, the control logic can cause the remainder of the wordlines (to include the selected wordline (WLn) and the unselected wordlines (WLn+1) positioned above the selected wordline (WLn)) to be charged to Vhigh.

Further, in these embodiments, during a fourth operation (e.g., Op_4), the control logic can cause maintaining the previously applied voltage to the unselected wordlines (WLn−1) below the selected wordline (WLn) and the unselected wordlines (WLn+1) above the selected wordline, e.g., 0V and Vhigh, respectively in one embodiment or both at Vhigh in another embodiment. Concurrently, the control logic can cause the selected wordline (WLn) to be discharged until the one of the ground voltage or the negative voltage is applied, which causes a soft erase voltage between a channel of the memory cell and the selected wordline. This soft erase voltage (e.g., erase polarity), when sufficiently high, causes a partial erasure of the threshold voltage of the memory cell.

Figure 10:
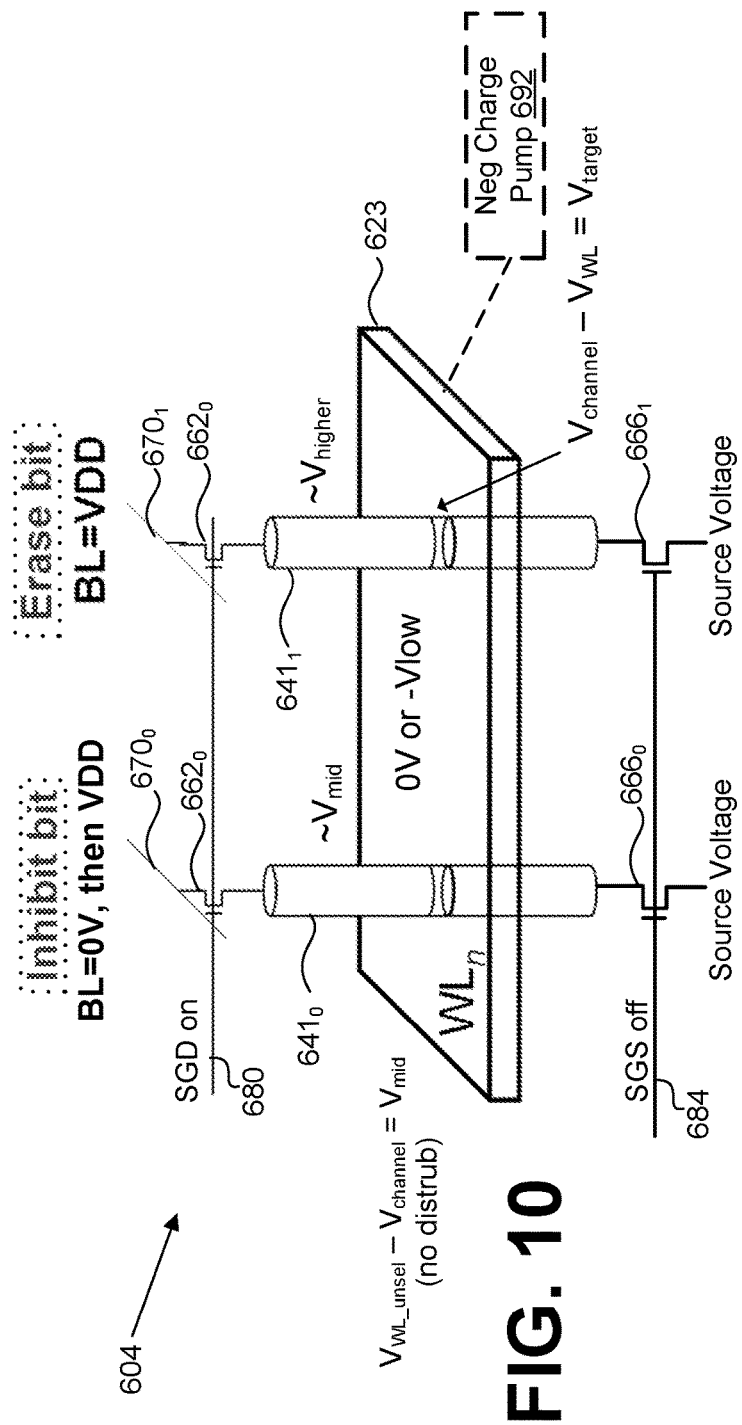
FIG. 10 is a simplified perspective, zoomed-in view of two pillars and a selected wordline according to an embodiment.
Figure 11:
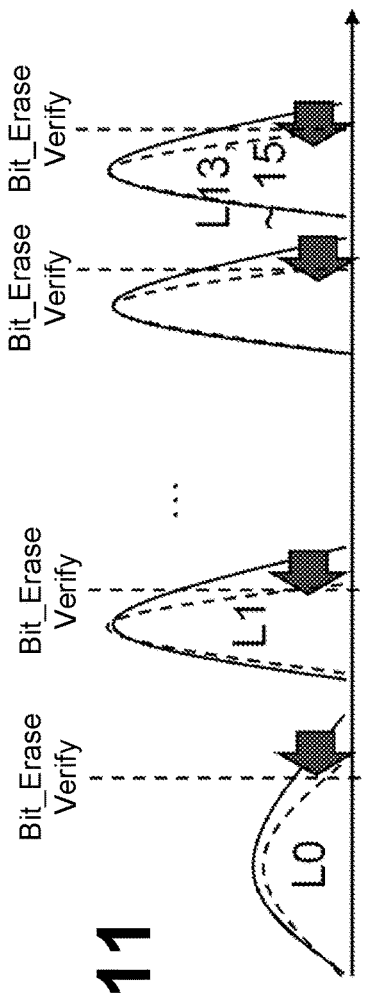
FIG. 11 is a graph illustrating fast bit erase of an upper tail of any of a set of threshold voltage distributions according to an embodiment.

FIG. 10 is a simplified perspective, zoomed-in view of two pillars and a selected wordline according to an embodiment. For example, the two pillars and selected wordline can be a part of the memory array 604 discussed with reference to FIG. 6, which structural design is not described in more detail here. With additional reference to FIG. 12, however, the sequencing and levels of voltage application to the first data line $670_0$, the second data line $670_1$, the unselected wordlines, and the selected wordline (WLn) can be altered in order to boost the channel voltage ($V_{channel}$) of a memory cell to be erased to still higher voltages (e.g., at or in excess 18V). For example, if the channel voltage ($V_{channel}$) of the memory cell is at about 20V and the wordline voltage ($V_{W}L$) of the selected wordline is between 0 and −2.5V, then the target erase polarity voltage ($V_{target}$) can be between ~18-20V. These higher erase voltages may be necessary in order to erase part of a Vt distribution (e.g., tighten an upper tail) of lower voltage Vt distributions, and thus using this approach along, or together with, the approach of FIGS. 6-9, be able to erase a memory cell that contributes to most or all of multiple threshold voltage distributions, e.g., L0 through L15 in QLCs, as illustrated in FIG. 11, or L0 through L31 in PLCs.

In at least some embodiments, boosting the channel voltage of a memory cell to be erased to such high voltage levels brings additional challenges with avoiding program disturb on unselected wordlines. These program disturb risks can be ameliorated with stepping the voltage of the unselected wordlines and channel voltage of the first pillar (or other pillars coupled with unselected wordlines) to higher voltages as the channel voltage of the memory cell to be erased is also increased in a stepped manner, as discussed in detail with reference to FIG. 10 and FIG. 12. This can ensure that the difference between the unselected wordline voltages and the channel voltage of the selected wordline (WLn) is no more than a mid-level voltage ($V_{mid}$) difference, which can be around 8-10 volts in various embodiments.

Figure 12:
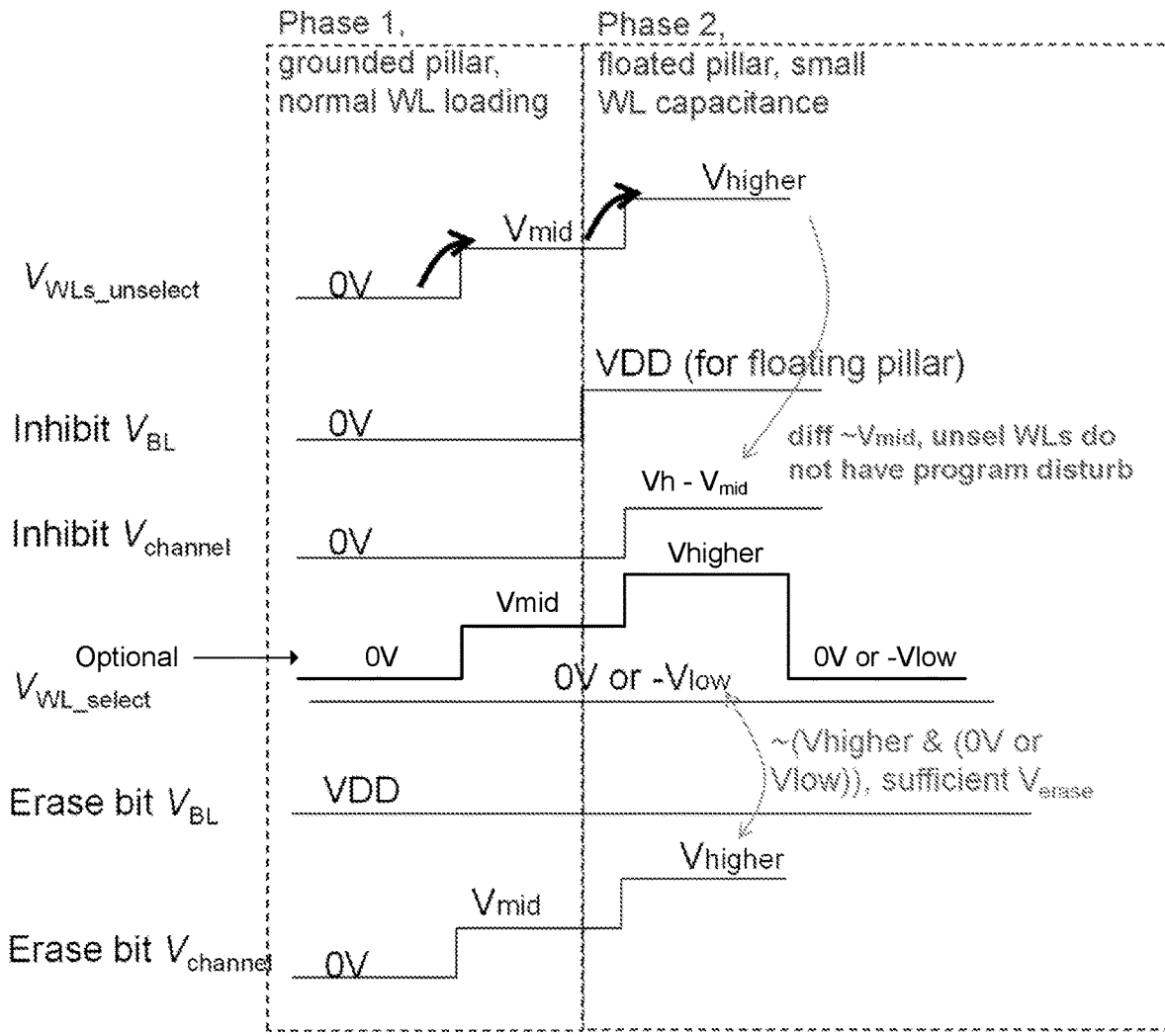
FIG. 12 is a graph illustrating of a set of waveforms that performs the fast bit erase associated with FIG. 10 according to an embodiment.

FIG. 12 is a graph illustrating of a set of waveforms that performs the fast bit erase associated with FIG. 10 according to an embodiment. Thus, with additional reference to FIG. 10, the control logic can cause multiple wordlines of a memory device to be discharged after a program pulse programs one or more memory cells coupled with a selected wordline 623 of the multiple wordlines. Accordingly, the wordlines begin at a ground voltage, e.g., 0V. The control logic initially causes unselected wordlines of the multiple wordlines to be charged to a first voltage level (e.g., $V_{mid}$) to boost a channel voltage in memory cells coupled with a second pillar $641_1$. Because the voltage on the first data line $670_0$ (e.g., inhibit BL) starts at 0V, when the first drain select transistor $662_0$ is turned on, there is conduction between the first data line $670_0$ and the first pillar $641_0$, causing any voltage on the first pillar $641_0$ to be discharged to approximately 0V as well. After a period of time, e.g., passing between Phase 1 and Phase 2 illustrated in FIG. 12, the control logic can cause the unselected wordlines to be charged to a second voltage level ($V_{higher}$) that is higher than the first voltage level, as illustrated in the "$V_{WLs\_unselect}$" waveform." In at least some embodiments, the second voltage level is about twice that of the first voltage level.

In various embodiments, the control logic further causes a supply voltage (e.g., VDD) to be applied to the second data line $670_1$ to, once the second drain select transistor $662_1$ is turned on, cause a voltage of the second pillar $641_1$ to float, illustrated by the "Erase bit $V_{BL}$" waveform in FIG. 12. Because the supply voltage is applied to the second data line $670_1$ throughout Phase 1 and Phase 2, the channel voltage of the memory cell to be partially erased can also step to $V_{mid}$ and then on to $V_{higher}$, e.g., approximately the first and second voltage levels, as illustrated in the "Erase bit $V_{channel}$" waveform in FIG. 12. In this way, the stress between unselected WLs and the inhibit channel is close to a median voltage $V_{mid}$ and avoids program disturbs on memory cells connected to the first pillar $641_0$. If the inhibit bit pillar, e.g., the first pillar $641_0$, is not in a $V_{mid}$ voltage, program or erase disturb can occur on either a cell connected to an unselected WL or a cell connected to a selected WL.

In at least some embodiments, during the period of time (e.g., of transition between Phase 1 and Phase 2), the control logic can transition to cause the supply voltage (e.g., VDD) to be applied to the first data line $670_0$ to also cause a voltage of the first pillar $641_0$ to float, as illustrated in the "Inhibit $V_{BL}$" waveform. The first pillar $641_0$ floats because the high voltage on the first data line $670_0$ keeps the first drain select transistor first drain select transistor $662_0$ from turning on. This transition can cause the channel voltage ("Inhibit $V_{channel}$") of the first pillar $641_0$ to increase from ground to a mid-level voltage (e.g., $V_{higher}$–$V_{mid}$), such as between 8-10V in different embodiments. Thus, the difference between the higher voltage ($V_{higher}$) and $V_{mid}$ can be about the same as $V_{mid}$, and thus not sufficient to cause program disturb on the unselected wordlines.

As before, the control logic can also cause one of the ground voltage (0V) or a negative voltage, –$V_{low}$ (e.g., –1 to –2.5V) to be applied to the selected wordline 623 (WLn) to increase the soft erase voltage (e.g., stress) between the channel of a memory cell coupled with the second pillar $641_1$ and the selected wordline, WLn. In these embodiments, this soft erase voltage causes a threshold voltage (Vt) stored in the memory cell to be partially erased via the second pillar $641_1$, for example. As discussed, the soft erase voltage is the difference between the channel voltage ($V_{higher}$) and the selected wordline voltage ($V_{WL\_select}$), which in the current embodiments can be between ~18-20V, for example. These higher voltages can enable erasure of a threshold voltage within a memory cell that is in a lower Vt state.

In some embodiments, causing the one of the ground voltage or the negative voltage to be applied to the selected wordline 623 includes causing the selected wordline 623 to be charged together with causing the unselected wordlines to be charged. Further, after a determined time of (or in response to) completing charging the unselected wordlines, e.g., after reaching Vhigher (FIG. 12) or Vhigh (FIG. 6), causing the selected wordline 623 to be discharged until one of the ground voltage or the negative voltage is applied. If the negative voltage is applied, an optional negative charge pump 692 can be used to reduce the voltage level on the selected wordline 623.

Figure 13:
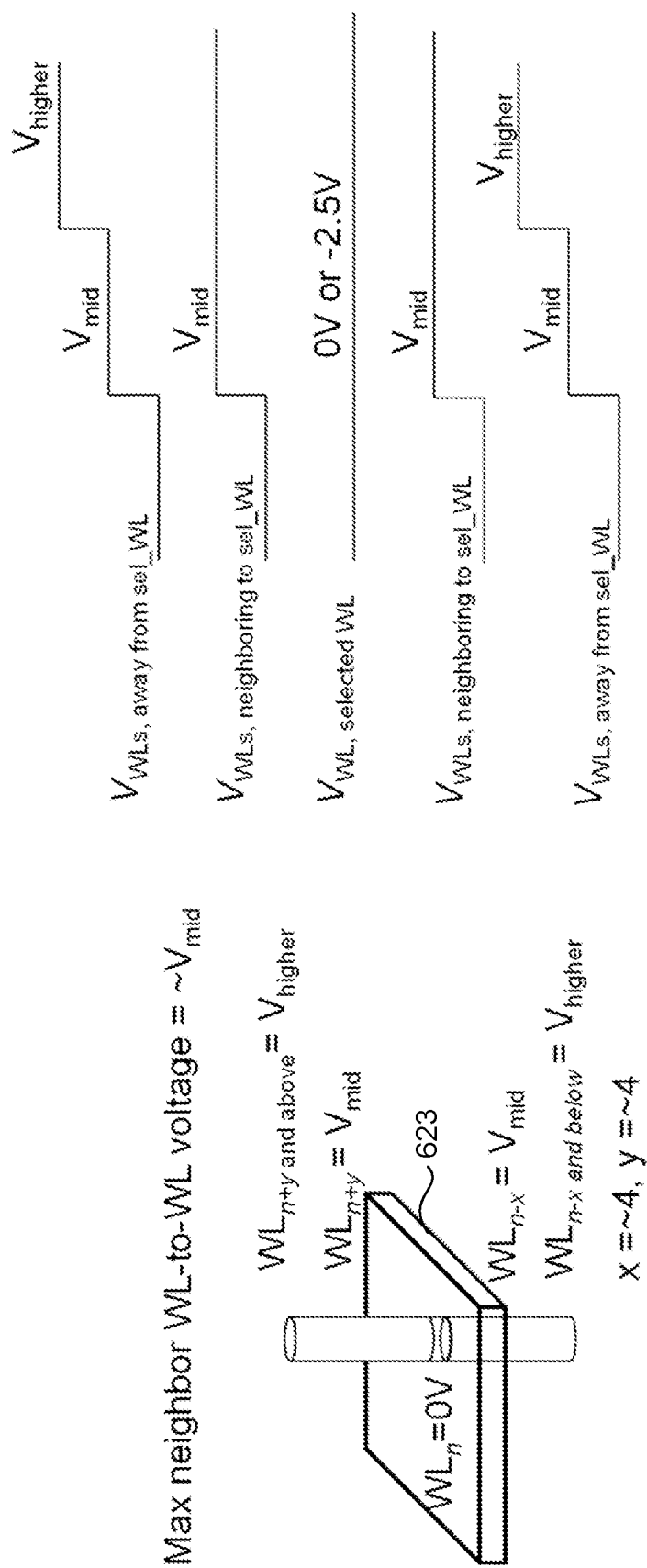
FIG. 13 is a simplified perspective, zoomed-in view of a pillar coupled with a selected wordline and many unselected wordlines according to some embodiments.

FIG. 13 is a simplified perspective, zoomed-in view of a pillar coupled with a selected wordline 623 and many unselected wordlines according to some embodiments. In these embodiments, due to the negative impacts of capacitance built up when wordline-to-wordline voltages differ too much, certain limitations can be applied to voltages applied to unselected wordlines that are adjacent to the selected wordline 623, whether above or below the selected wordline. Thus, for example, causing the unselected wordlines to be charged to the second voltage ($V_{higher}$) can include leaving a subset of the unselected wordlines at the first voltage ($V_{mid}$), where the subset of the unselected wordlines include those that are immediately adjacent (e.g., neighboring) to the selected wordline 623. In some embodiments, the subset of the unselected wordlines is between two and six unselected wordlines immediately adjacent to the selected wordline 623. In one embodiment, the subset of the unselected wordlines include four unselected wordlines neighboring to the selected wordline 623. This enables a certain level of gradation of voltage across the wordlines to prevent dielectric breakdown between the wordlines.

Figure 14:
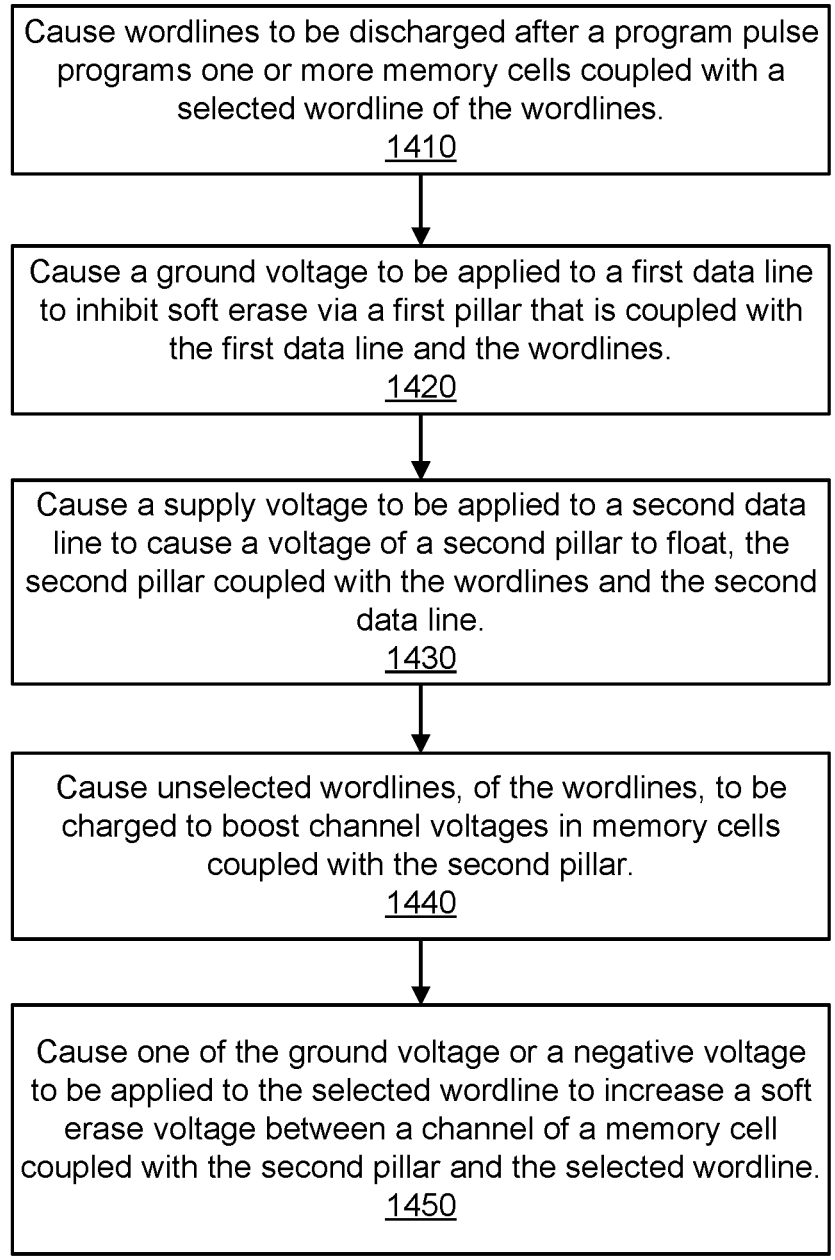
FIG. 14 is a flow diagram of an example method of performing a fast bit erase operation on one of the highest voltage threshold voltage distributions according to some embodiments.

FIG. 14 is a flow diagram of an example method 1400 of performing a fast bit erase operation on one of the highest voltage threshold voltage distributions according to some embodiments. The method 1400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1400 is performed by control logic of the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1410, the wordline are discharged. For example, the processing logic causes multiple wordlines of a memory device to be discharged after a program pulse programs one or more memory cells coupled with a selected wordline of the multiple wordlines.

At operation 1420, a ground voltage is applied to a first data line. For example, the processing logic causes a ground voltage to be applied to a first data line to inhibit soft erase via a first pillar that is coupled with the first data line and the multiple wordlines.

At operation 1430, a supply voltage is applied to a second data line. For example, the processing device causes a supply voltage to be applied to a second data line to cause a voltage of a second pillar to float, where the second pillar is coupled with the multiple wordlines and the second data line.

At operation 1440, the unselected wordlines are charged. For example, the processing logic causes unselected wordlines, of the multiple wordlines, to be charged to boost channel voltages in memory cells coupled with the second pillar.

At operation 1450, a low voltage is applied to the selected wordline. For example, the processing logic causes one of the ground voltage or a negative voltage to be applied to the selected wordline to increase a soft erase voltage between a channel of a memory cell coupled with the second pillar and the selected wordline. In disclosed embodiments, the soft erase voltage causes a threshold voltage stored in the memory cell to be partially erased, e.g., via the second pillar.

FIG. 15 is a flow diagram of an example method 1500 of performing a fast bit erase operation on any threshold voltage distribution according to some embodiments. The method 1500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1500 is performed by control logic of the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1510, the wordline are discharged. For example, the processing logic causes multiple wordlines of a memory device to be discharged after a program pulse programs one or more memory cells coupled with a selected wordline of the multiple wordlines.

At operation 1520, the unselected wordlines are initially charged. For example, the processing logic initially causing unselected wordlines of the plurality of wordlines to be charged to a first voltage level to boost a channel voltage in memory cells coupled with a second pillar, wherein a first pillar is coupled with a first data line, the second pillar is coupled with a second data line, and the multiple wordlines are coupled with the first pillar and the second pillar.

At operation 1530, the unselected wordlines are further charged. For example, the processing logic, after a period of time, causes the unselected wordlines to be charged to a second voltage level that is higher than the first voltage level. This period of time can be between a transition between phases in which wordlines are further boosted.

At operation 1540, a supply voltage is applied to the second data line. For example, the processing logic causes a supply voltage to be applied to the second data line to cause a voltage of the second pillar to float.

At operation 1550, a ground voltage is applied to the first data line. For example, the processing logic initially causes a ground voltage to be applied to the first data line to inhibit soft erase via the first pillar.

At operation 1560, the supply voltage is applied to the first data line. For example, the processing logic, during the period of time, transitions to cause the supply voltage to be applied to the first data line to also cause a voltage of the first pillar to float.

At operation 1570, a low voltage is applied to the selected wordline. For example, the processing logic causes one of the ground voltage or a negative voltage to be applied to the selected wordline to increase a soft erase voltage between a channel of a memory cell coupled with the second pillar and the selected wordline. In disclosed embodiments, the soft erase voltage causes a threshold voltage stored in the memory cell to be erased, e.g., via the second pillar.

Figure 16:
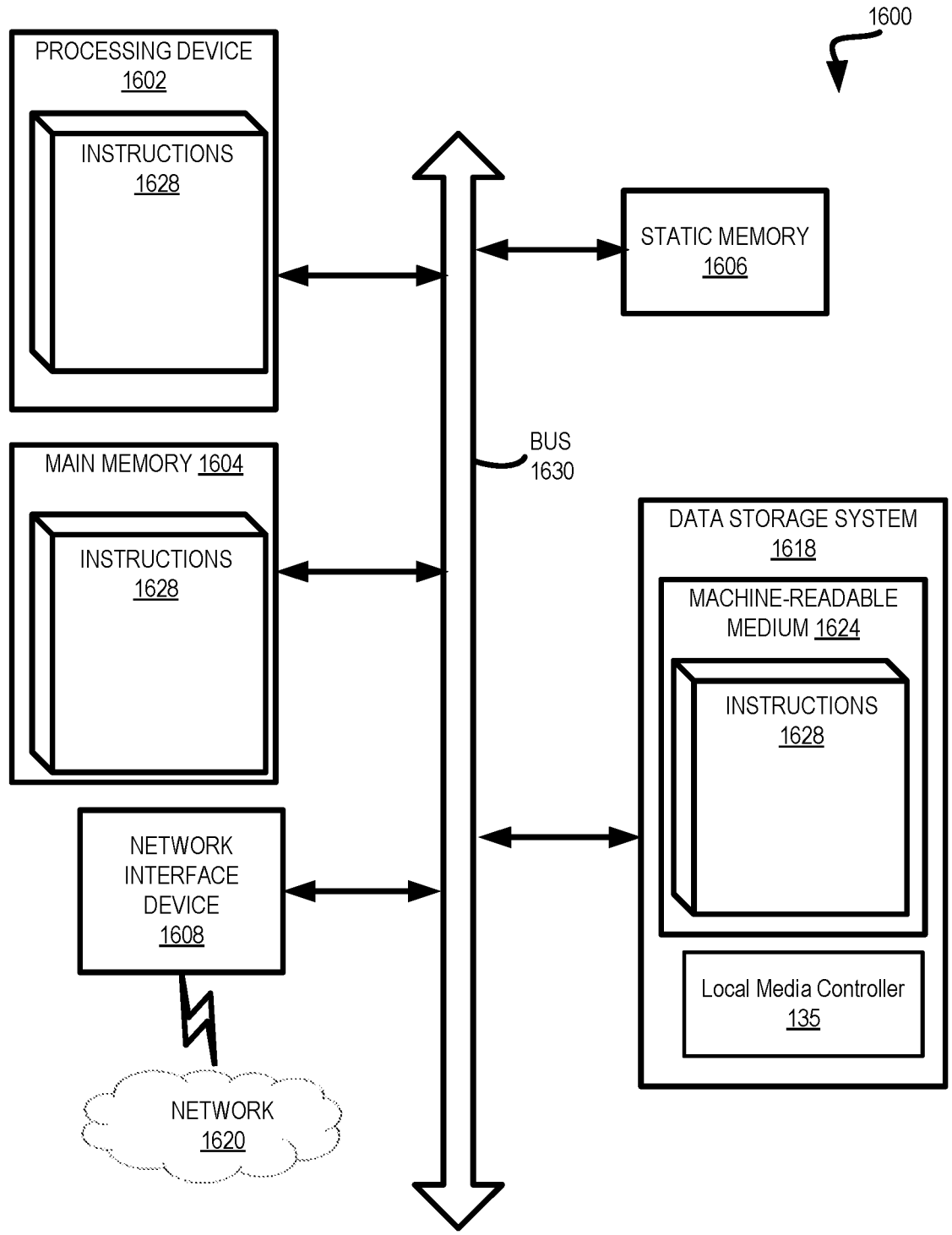
FIG. 16 is a block diagram of an example computer system in which embodiments of the present disclosure can operate.

FIG. 16 illustrates an example machine of a computer system 1600 within which a set of instructions, for causing the machine to perform any one or more of the methodologies discussed herein, can be executed. In some embodiments, the computer system 1600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM) or Rambus DRAM (RDRAM), etc.), a static memory 1610 (e.g., flash memory, static random access memory (SRAM), etc.), and a data storage system 1618, which communicate with each other via a bus 1630.

Processing device 1602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 can also be one or more special-purpose processing devices such as an application specific integrated circuit (ASIC), a field programmable gate array (FPGA), a digital signal processor (DSP), network processor, or the like. The processing device 1602 is configured to execute instructions 1628 for performing the operations and steps discussed herein. The computer system 1600 can further include a network interface device 1612 to communicate over the network 1620.

The data storage system 1618 can include a machine-readable storage medium 1624 (also known as a computer-readable medium) on which is stored one or more sets of instructions 1628 or software embodying any one or more of the methodologies or functions described herein. The data storage system 1618 can further include the local media controller 135, the page buffer 152 or 352, and the queue 131 that were previously discussed. The instructions 1628 can also reside, completely or at least partially, within the main memory 1604 and/or within the processing device 1602 during execution thereof by the computer system 1600, the main memory 1604 and the processing device 1602 also constituting machine-readable storage media. The machine-readable storage medium 1624, data storage system 1618, and/or main memory 1604 can correspond to the memory sub-system 110 of FIG. 1A.

In one embodiment, the instructions 1628 include instructions to implement functionality corresponding to a controller (e.g., the memory sub-system controller 115 of FIG. 1A). While the machine-readable storage medium 1624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array comprising:
        a first data line;
        a first pillar coupled with the first data line;
        a second data line;
        a second pillar coupled with the second data line; and
        a plurality of wordlines coupled with the first pillar and the second pillar; and
    control logic operatively coupled with the memory array, the control logic to perform operations comprising:
        causing the plurality of wordlines to be discharged after a program pulse is applied to program one or more memory cells coupled with a selected wordline of the plurality of wordlines;
        causing a supply voltage to be applied to the second data line to cause a voltage of the second pillar to float;
        causing a ground voltage to be applied to the first data line to inhibit soft erase via the first pillar;
        causing unselected wordlines of the plurality of wordlines to be charged to boost channel voltages in memory cells coupled with the second pillar; and
        causing one of the ground voltage or a negative voltage to be applied to the selected wordline to increase a soft erase voltage between a channel of a memory cell coupled with the second pillar and the selected wordline, causing a threshold voltage stored in the memory cell to be partially erased.

2. The memory device of claim 1, wherein the threshold voltage stored in the memory cell contributes to an upper tail of one of at least two of a set of highest threshold voltage distributions of a plurality of multi-level memory cells coupled with the selected wordline.

3. The memory device of claim 1, wherein causing the threshold voltage stored in the memory cell to be partially erased occurs one of:
    after the program pulse and after a program verify is performed on the memory cell; or
    between the program pulse and the program verify being performed on the memory cell.

4. The memory device of claim 1, wherein the memory array further comprises:
    a first drain select transistor coupled with the first pillar;
    a second drain select transistor coupled with the second pillar; and
    a drain select gate line coupled with gates of the first drain select transistor and the second drain select transistor; and
    wherein the operations further comprise sending a drain select signal to the drain select gate line to turn on the first drain select transistor and the second drain select transistor.

5. The memory device of claim 1, wherein the memory array further comprises:
    a first source select transistor coupled with the first pillar;
    a second source select transistor coupled with the second pillar;
    a source select gate line coupled with gates of the first source select transistor and the second source select transistor; and
    wherein the operations further comprise sending a source select signal to the source select gate line to turn off the first source select transistor and the second source select transistor.

6. The memory device of claim 1, wherein causing the one of the ground voltage or negative voltage to be applied to the selected wordline comprises:
 causing the selected wordline to be charged together with causing the unselected wordlines to be charged; and
 causing, in response to completing charging the unselected wordlines, the selected wordline to be discharged until the one of the ground voltage or the negative voltage is applied.

7. The memory device of claim 1, wherein the operations further comprise causing another memory cell coupled with the selected wordline to be partially erased in incremental step erasure until an upper tail of a threshold voltage distribution is within a threshold value of a bit erase verify voltage.

8. The memory device of claim 1, further comprising a negative charge pump to apply the negative voltage to the selected wordline.

9. A method comprising:
 causing a plurality of wordlines of a memory device to be discharged after a program pulse programs one or more memory cells coupled with a selected wordline of the plurality of wordlines;
 initially causing unselected wordlines of the plurality of wordlines to be charged to a first voltage level to boost a channel voltage in memory cells coupled with a second pillar, wherein a first pillar is coupled with a first data line, the second pillar is coupled with a second data line, and the plurality of wordlines are coupled with the first pillar and the second pillar;
 after a period of time, causing the unselected wordlines to be charged to a second voltage level that is higher than the first voltage level;
 causing a supply voltage to be applied to the second data line to cause a voltage of the second pillar to float;
 initially causing a ground voltage to be applied to the first data line to inhibit soft erase via the first pillar;
 during the period of time, transitioning to cause the supply voltage to be applied to the first data line to also cause a voltage of the first pillar to float; and
 causing one of the ground voltage or a negative voltage to be applied to the selected wordline to increase a soft erase voltage between a channel of a memory cell coupled with the second pillar and the selected wordline, causing a threshold voltage stored in the memory cell to be partially erased.

10. The method of claim 9, wherein the threshold voltage stored in the memory cell contributes to an upper tail of any of multiple threshold voltage distributions of a plurality of multi-level memory cells coupled with the selected wordline.

11. The method of claim 9, wherein causing the threshold voltage stored in the memory cell to be partially erased occurs one of:
 after the program pulse and after a program verify is performed on the memory cell; or
 between the program pulse and the program verify being performed on the memory cell.

12. The method of claim 9, further comprising sending a drain select signal to a drain select line to turn on a first drain select transistor, which is coupled with the first pillar, and a second drain select transistor, which is coupled with the second pillar.

13. The method of claim 9, further comprising sending a source select signal to a source select line to turn off a first source select transistor, which is coupled with the first pillar, and a second source select transistor, which is coupled with the second pillar.

14. The method of claim 9, wherein causing the one of the ground voltage or negative voltage to be applied to the selected wordline comprises:
 causing the selected wordline to be charged together with causing the unselected wordlines to be charged; and
 causing, in response to completing charging the unselected wordlines, the selected wordline to be charged until one of the ground voltage or the negative voltage is applied.

15. The method of claim 9, wherein causing the unselected wordlines to be charged to the second voltage includes leaving a subset of the unselected wordlines at the first voltage, wherein the subset of the unselected wordlines comprises those that are immediately adjacent to the selected wordline.

16. The method of claim 15, wherein the subset of the unselected wordlines is between two and six unselected wordlines.

17. A method comprising:
 causing a plurality of wordlines to be discharged after a program pulse programs one or more memory cells coupled with a selected wordline of the plurality of wordlines;
 causing a ground voltage to be applied to a first data line to inhibit soft erase via a first pillar that is coupled with the first data line and the plurality of wordlines;
 causing a supply voltage to be applied to a second data line to cause a voltage of a second pillar to float, the second pillar coupled with the plurality of wordlines and the first data line;
 causing unselected wordlines, of the plurality of wordlines, to be charged to boost channel voltages in memory cells coupled with the second pillar; and
 causing one of the ground voltage or a negative voltage to be applied to the selected wordline to increase a soft erase voltage between a channel of a memory cell coupled with the second pillar and the selected wordline, causing a threshold voltage stored in the memory cell to be partially erased.

18. The method of claim 17, wherein the threshold voltage stored in the memory cell contributes to an upper tail of one of at least two of a set of highest threshold voltage distributions of a plurality of multi-level memory cells coupled with the selected wordline.

19. The method of claim 17, wherein causing the threshold voltage stored in the memory cell to be partially erased occurs one of:
 after the program pulse and after a program verify is performed on the memory cell; or
 between the program pulse and the program verify being performed on the memory cell.

20. The method of claim 17, further comprising causing another memory cell coupled with the selected wordline to be partially erased in incremental step erasure until an upper tail of a threshold voltage distribution is within a threshold value of a bit erase verify voltage.

* * * * *